(12) United States Patent
Ejima

(10) Patent No.: US 7,635,912 B2
(45) Date of Patent: Dec. 22, 2009

(54) SEMICONDUCTOR DEVICE

(75) Inventor: Daisuke Ejima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/104,660

(22) Filed: Apr. 17, 2008

(65) Prior Publication Data
US 2008/0258317 A1  Oct. 23, 2008

(30) Foreign Application Priority Data
Apr. 19, 2007  (JP) .............................. 2007-110178

(51) Int. Cl.
*H01L 23/48* (2006.01)
(52) U.S. Cl. .................. 257/678; 257/E23.002
(58) Field of Classification Search .................. 257/678, 257/787, 686, E23.002
See application file for complete search history.

(56) References Cited

U.S. PATENT DOCUMENTS 4,766,095 A * 8/1988 Hiroshi ......................... 438/116
5,386,342 A * 1/1995 Rostoker ...................... 361/749
5,892,289 A * 4/1999 Tokuno ......................... 257/783
6,534,858 B2 * 3/2003 Akram et al. ................. 257/706
6,605,779 B2 * 8/2003 Takata et al. ................. 174/559
6,707,167 B2 * 3/2004 Huang et al. ................. 257/790
7,145,253 B1 * 12/2006 Kim et al. .................... 257/790
2006/0197207 A1 * 9/2006 Chow et al. ................. 257/686

FOREIGN PATENT DOCUMENTS

JP      8-162573      6/1996
JP      10-22422      2/1998

* cited by examiner

*Primary Examiner*—Nathan W Ha
(74) *Attorney, Agent, or Firm*—Young & Thompson

(57) ABSTRACT

A resin layer covering a semiconductor chip on a wiring board is composed of a first resin layer and a second resin layer, wherein the first resin layer and the second resin layer differ in their plan view pattern, satisfying a relation of a<b, where "a" is difference in length in the direction from the center of the board towards the edges between the first resin layer and the second resin layer, and "b" is difference in length in the direction from the center of the board towards the corners between the first resin layer and the second resin layer.

8 Claims, 32 Drawing Sheets

⟨UNDER NORMAL TEMPERATURE⟩  ⟨UNDER FUSING TEMPERATURE OF SOLDER⟩

⟨UNDER FUSING TEMPERATURE OF SOLDER⟩

US 7,635,912 B2

SEMICONDUCTOR DEVICE

This application is based on Japanese patent application No. 2007-110178 the content of which is incorporated hereinto by reference.

BACKGROUND

1. Technical Field

The present invention relates to a semiconductor device, and in particular to a structure of semiconductor package.

2. Related Art

System-in-package (SiP, hereinafter) technology, realizing a plurality of functions such as memory, CPU (central processing unit) and so forth in a single package, has been attracting public attention as a semiconductor packaging technology expected as realizing more advanced functions and thinning of semiconductor devices. Package-on-package (PoP, hereinafter) technology is one known SiP technology, characterized by stacking of a plurality of semiconductor packages in a three-dimensional manner. PoP allows arbitrary selection of combination of a plurality of functions, as being adapted to applications. It can reduce the effective area, by virtue of its structure in which the semiconductor packages are stacked in a three-dimensional manner. It is, therefore, adoptable mainly to small-sized, thin, and multi-functional instruments such as mobile phones.

An exemplary sectional structure related to the conventional PoP technology is shown in FIG. 28. A first package 100 disposed on the lower stage has a wiring board 101 and a semiconductor chip 12 bonded thereon by the flip-chip bonding process, wherein an underfill resin 13 is filled between the wiring board 101 and the semiconductor chip 12. The semiconductor chip 12 and the wiring board 101 are connected through bumps 19 composed of gold, solder, or the like. On the back surface of the wiring board 101, solder balls 17 are formed as external connection terminals. It is to be understood that the drawing is a schematic one, wherein the first semiconductor package 100 in practice generally causes some warping as described later.

A second semiconductor package 200 disposed on the upper stage is configured by stacking two semiconductor chips 12 stacked on the wiring board 101, wherein the wiring board 101 and the semiconductor chips 12 are bonded by the wire bonding process through wires 14, and are molded by a molding resin 15. The semiconductor chips 12 and the wiring board 101, or two semiconductor chip 12 are stacked while placing a chip mounting adhesive 16. The first semiconductor package 100 and the second semiconductor package 200 are bonded through the solder balls 17, and are thereby configured as a PoP.

FIGS. 29A and 29B and FIGS. 30A and 30B show the first semiconductor packages. FIGS. 29A and 29B show a configuration having the semiconductor chip 12 and the board 11 connected by wire bonding through wires 14, and FIGS. 30A and 30B show a configuration based on the flip-chip bonding process. In the individual drawings, figures A and B are plan views and sectional views taken along line A-A', respectively. It is not always necessary for the first semiconductor package in the flip-chip bonding that the semiconductor chip is covered with the molding resin, but a portion at and around the semiconductor chip 12 may be covered with the molding resin 15, as shown in FIG. 30.

In this sort of PoP, suppression of warping of the first semiconductor package 100 may be one problem to be solved. The warping is mainly ascribable to difference in coefficient of thermal expansion between the board and the semiconductor chip. As described later, the warping of the first semiconductor package 100 may result in bonding failure at portions of bonding with the second semiconductor package 200 stacked thereon.

Technical literatures relevant to suppression of semiconductor packages may be exemplified by Japanese Laid-Open Patent Publication Nos. H08-162573 and H10-022422.

Japanese Laid-Open Patent Publication No. H08-162573 discloses a technique of suppressing floating of wires or warping of a semiconductor package formed by wire bonding, by molding a semiconductor chip using a double-layered resin composed of an inner cured resin layer and an outer cured resin layer. Use of a resin suppressive to wire floating may increase warping of the package, so that the wire portion is first molded using the resin suppressive to wire floating, and the outer circumference is then molded using a resin suppressive to warping.

Japanese Laid-Open Patent Publication No. H10-022422 discloses a technology of preventing cracks in the package, by configuring the molding resin of semiconductor chips using a low-stress inner resin layer and a low-hygroscopic outer resin layer.

As described in the above, warping of the first semiconductor package is exemplified as one critical issue in the PoP technology.

FIGS. 31A to 31C are sectional view schematically showing warping behaviors of the first semiconductor packages. FIG. 31A shows a case where wire bonding was adopted as a method of bonding a semiconductor chip, and FIGS. 31B and 31C show cases where the flip-chip bonding was adopted. FIGS. 31A and 31B show cases where the semiconductor chip 12 was covered with the molding resin 15, and FIG. 31C shows a case where the molding resin was not used. Irrespective of the structures, the first semiconductor packages warp to the upper side (semiconductor chip side) of the board 11 under normal temperature so as to cause convex warping (cry warping, hereinafter), and warp to the-lower side (solder ball side) of the board 11 under fusing temperature of solder so as to cause concave warping (smile warping, hereinafter). Although not so clear in the drawings, also the molding resin 15 warps conforming to warping of the board 11 and the semiconductor chip 12.

FIGS. 32A to 32C are schematic sectional views of a PoP structure using the first semiconductor package shown in FIGS. 31A to 31C. The first semiconductor packages 100 shown in FIGS. 32A to 32C have the same configurations with those shown in FIGS. 31A to 31C, respectively. The second semiconductor package 200 has the same configuration with that shown in FIG. 28. The drawings show states of bonding when the first semiconductor package 100 and the second semiconductor package 200 are bonded, that is, the states of bonding under fusing temperature of solder. Because the first semiconductor package 100 causes the smile warping, unbonded portions 20 appear between the first semiconductor package 100 and the solder balls 17 on the second semiconductor package 200. Although not so clear in the drawings, also the molding resin 15 of the first semiconductor package 100 warps conforming to warping of the board 11 and the semiconductor chip 12.

As described in the above, large warping under fusing temperature of solder may result in bonding failure between the first semiconductor package 100 and the second semiconductor package 200. Even if the bonding failure should not occur, bondability may degrade due to temperature cycle in the succeeding processes of manufacturing, making it difficult to obtain a sufficient reliability of bonding.

In addition, thinning and faster speed of communication more than ever are required for recent semiconductor devices. It may, therefore, be necessary to thin the board in the PoP structure than ever, but thinning may reduce the rigidity, because rigidity of the board depends on the thickness, so that the warping of the package may increase more than ever.

Moreover, in view of increasing communication speed, the semiconductor chip is preferably bonded to the board by the flip-chip bonding process. This is because, in the flip-chip bonding process, the board and the circuit plane of the semiconductor chip are directly bonded without using wires therebetween. However, the flip-chip bonding process generally requires process temperatures higher than that of wire bonding, so that amount of change in temperature away from normal temperature may become larger, and the warping may become more distinctive.

As described in the above, efforts of satisfying recent requirements of thinning and speedup of semiconductor device have increased the amount of warping of the semiconductor package than ever. In view of solving this problem and of providing a semiconductor device excellent in the bonding reliability, only a limited effect may be attainable simply by adopting the packaging technologies disclosed in the Patent Publications described in the above, raising a need of further improvement.

SUMMARY

According to the present invention, there is provided a semiconductor device having a semiconductor chip connected to a board having terminal portions formed thereon, a first resin layer covering the semiconductor chip, and a second resin layer covering the first resin layer, wherein the first resin layer and the second resin layer differ in the plan view pattern, and satisfy a relation of a<b, where "a" is difference in length in the direction from the center of the board towards the edges between the first resin layer and the second resin layer, and "b" is difference in length in the direction from the center of the board towards the corners between the first resin layer and the second resin layer.

Based on a concept that it is important to suppress warping of the first semiconductor package in the process of forming the PoP structure, the present inventors thoroughly investigated into a mechanism of warping of the semiconductor package. The present inventors consequently put a focus on the fact that curvature of warping in the semiconductor package becomes largest in the direction from the center of the package towards the corners, and completed the present invention.

More specifically, the present inventors came up with an idea of making the plan view patterns of the first resin layer and the second resin layer covering the semiconductor chip differ from each other, while making the length of the second resin layer in the direction from the center of the wiring board 101 towards the corners of the wiring board 101 (direction B-B') longer than the length from the center towards the edges (direction A-A'). In this configuration, a process of forming the PoP structure (at fusing temperature of solder) may cause downward force at the corners and upward force at the edges, so that the smile warping which tends to appear when the PoP structure is formed (at fusing temperature of solder) may be suppressed by an effect of canceling the warping stress. By adopting this configuration, the warping stress produced in the direction towards the corners may effectively be suppressed, as compared with the configurations of the conventional technical literatures, or with the case where the first resin layer and the second resin layer having analogous patterns are arranged.

According to the present invention, warping of the semiconductor package may be suppressed, and semiconductor devices excellent in the bonding reliability may be provided.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will describe the individual embodiments of the present invention, referring to the attached drawings.

First Embodiment

A first embodiment of the present invention will be explained, referring to FIG. 1A to FIG. 13D.

Figure 1A:
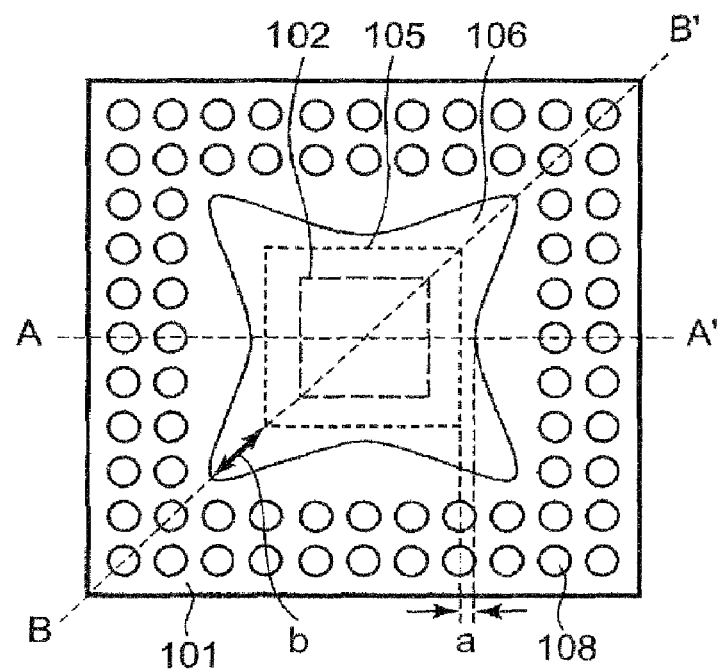
FIGS. 1A to 13D show semiconductor devices according to a first embodiment of the present invention.
Figure 1B:
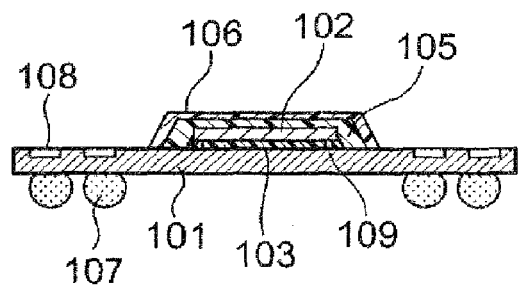
Figure 1C:

FIG. 1 shows a structure of a first semiconductor package according to a first embodiment of the present invention. FIG. 1A is a plan view, FIG. 1B is a sectional view taken along direction A-A' in FIG. 1A, and FIG. 1C is a sectional view taken along direction B-B'. The board on which the semiconductor chip 102 will be mounted is not specifically limited, allowing use of a wiring board 101 having therein an interconnect layer. Both of the wiring board 101 and the semiconductor chip 102 are square, bonded by flip-chip bonding through bumps 109 composed of gold, solder or the like, and have an underfill resin 103 filled in a gap therebetween. The wiring board 101 has lands (terminal portions) 108 on the surface thereof. The resin layer covering the semiconductor chip 102 is composed of a first resin layer 105 and a second resin layer 106. The first resin layer 105 and the second resin layer 106 have different plan view patterns. As shown in the drawing, a relation a<b is satisfied, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106. In short, the plan view pattern of the second resin layer 106 is such as swelling out from the center more largely towards the corners than towards the edges. Degree of swelling of the second resin layer 106 at the corners thereof is preferably not so large as bringing the layer into contact with the lands 108. The wiring board 101 has solder balls 107 formed on the back surface thereof.

Figure 2A:
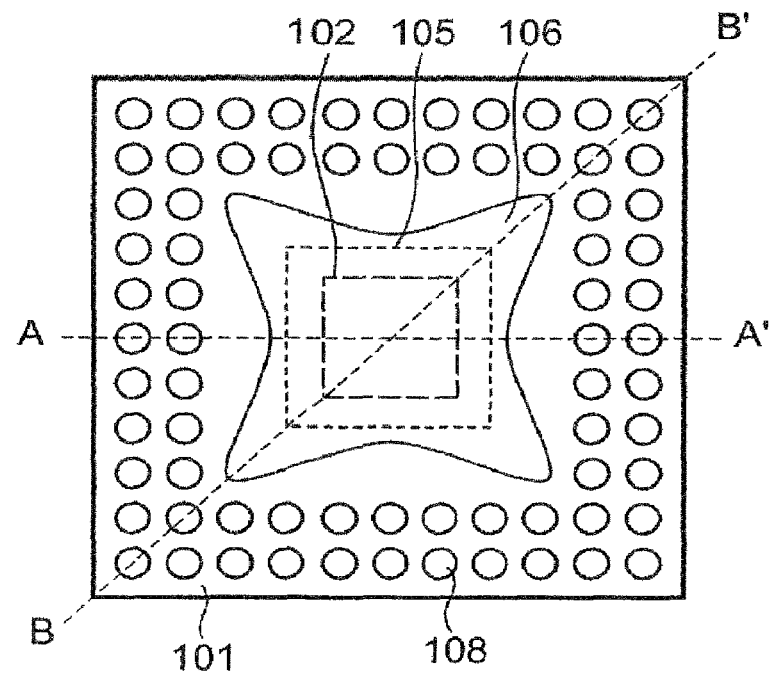
Figure 2B:
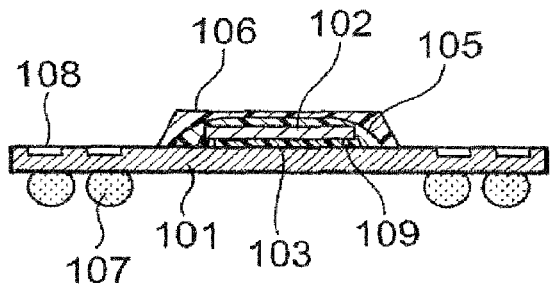
Figure 2C:
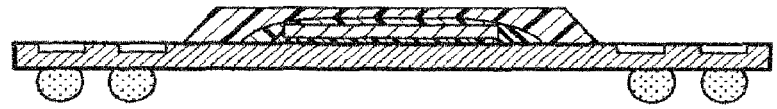
Figure 3:
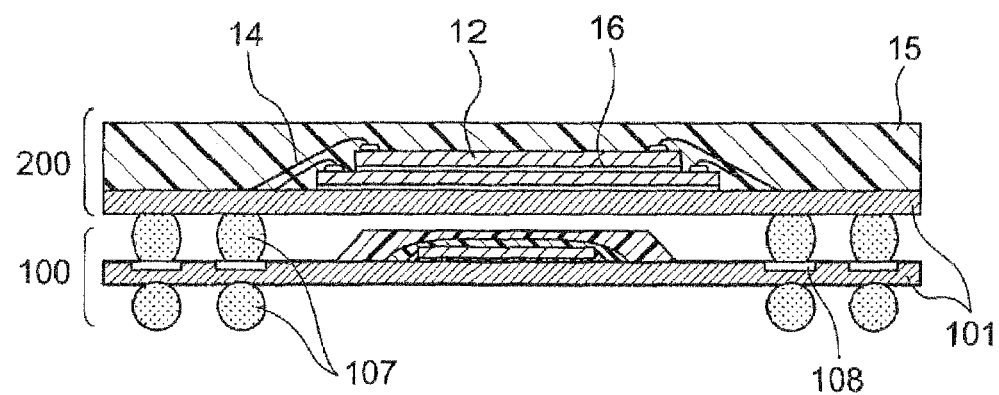

Next, a method of manufacturing the first semiconductor package of this embodiment will be explained (without illustration). The semiconductor chip 102 is bonded to the wiring board 101 having the lands 108 formed thereon, through the bumps 109 composed of gold, solder, or the like, by flip-chip bonding. A gap between the wiring board 101 and the semiconductor chip 102 is filled with the underfill resin 103. Next, the first resin layer 105 and the second resin layer 106 are sequentially formed. The first resin layer 105 is selectively formed so as to cover the semiconductor chip 102. The first resin layer 105 and the second resin layer 106 are designed to have different plan view patterns. The first resin layer 105 may be formed by publicly-known compression molding using die, printing, potting or the like. The second resin layer 106 may be formed by compression molding using die. The solder balls 107 are then formed on the back surface of the wiring board 101. FIGS. 1A to 1C show a final form obtained when the first resin layer 105 and the second resin layer 106 were formed by compression molding, whereas FIGS. 2A to 2C show a final form obtained when the first resin layer 105 was formed by printing or potting, and the second resin layer 106 was formed by compression molding.

In this configuration, the first resin layer 105 and the second resin layer 106 differ in the plan view pattern, wherein a relation a<b is satisfied, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106. Accordingly, a process of forming the PoP structure (at fusing temperature of solder) may cause downward force at the corners and upward force at the edges, so that the smile warping which tends to appear when the PoP structure is formed (at fusing temperature of solder) may be suppressed by an effect of canceling the warping stress.

The first resin layer 105 and the second resin layer 106 may be configured also by using those having properties described below. For the first resin layer 105 brought into contact with the semiconductor chip, resins showing properties excellent in adhesiveness with silicon may be used. More specifically, highly-adhesive epoxy resin, phenolic curing agent and so forth may be adoptable. They are flame retardant resins, having relatively low coefficients of thermal expansion [$\alpha 1$ (coefficient of thermal expansion up to the glass transition point) =6 to 12 ppm/° C., and $\alpha 2$ (coefficient of thermal expansion above glass transition point)=25 to 45 ppm/° C.]. The second resin layer 106 may typically have a coefficient of thermal expansion $\alpha 1$ of 25 ppm/° C. or larger, and $\alpha 2$ of 100 ppm/° C. or larger. Any resin having a flexural modulus of 10 Gpa or larger under normal temperature, and of 100 MPa or larger under heating, and Tg (glass transition point) of 135° C. may be used. The second resin layer 106 may adopt resins having coefficients of thermal expansion larger than those adopted by the first resin layer 105.

As described in the above, by appropriately selecting combinations of performances of the first resin layer 105 and the second resin layer 106, warping of the semiconductor package may effectively be suppressed, while ensuring reliability in adhesiveness between the resin and the semiconductor chip.

The PoP structure (FIG. 3) may be obtained by stacking the second semiconductor package 200 on the first semiconductor package 100, and more specifically formed by bonding the lands 108 on the wiring board 101 of the first semiconductor package 100, with the bumps 107, opposed to the lands, formed on the back surface of the second semiconductor package 200. As described in the above, warping which tends to appear in the process of forming the PoP structure (at fusing temperature of solder) on the first semiconductor package 100 may be suppressed, and thereby bonding failure which tends to appear when the PoP structure is adopted may effectively be suppressed.

Figure 4A:
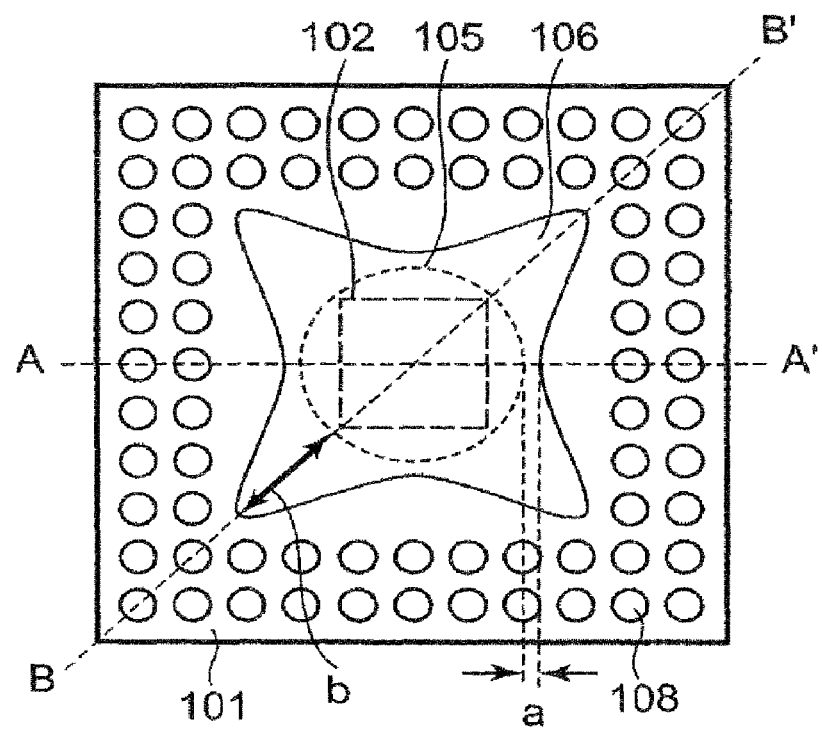
Figure 4B:
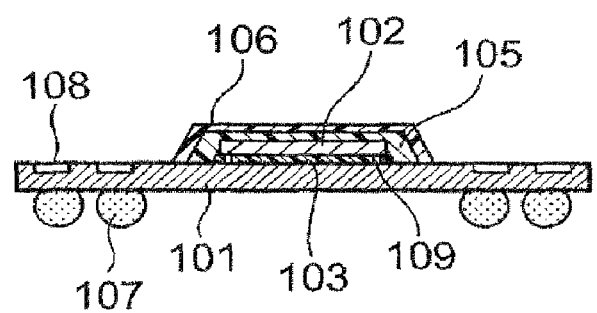
Figure 4C:
Figure 5A:
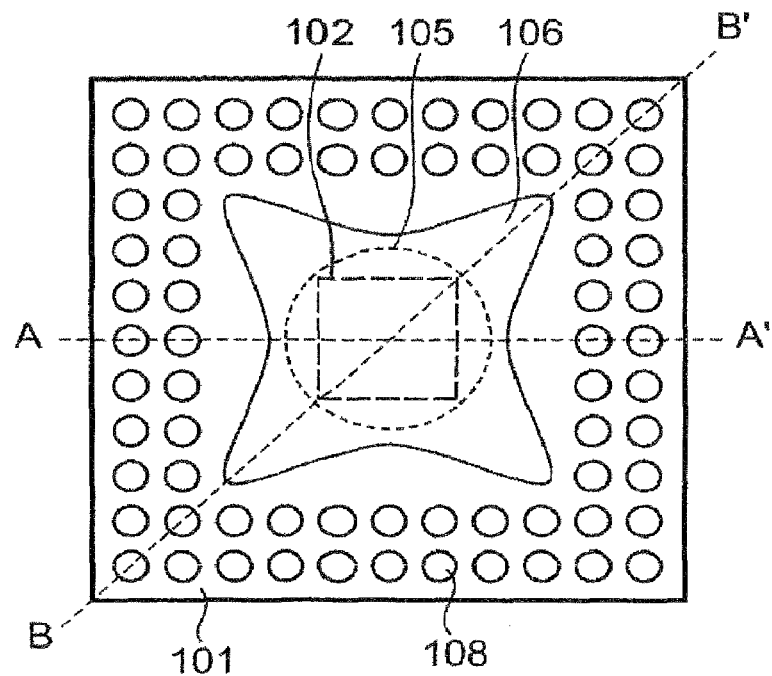
Figure 5B:
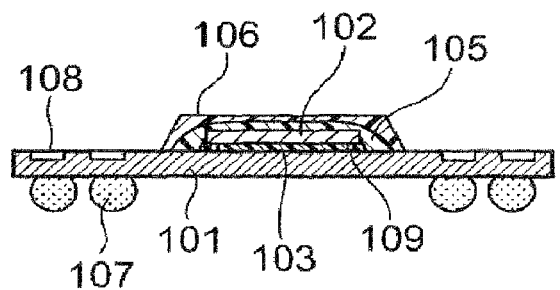
Figure 5C:

As a modified example, the plan view pattern of the first resin layer 105 in the first semiconductor package may be a circular pattern, as shown in FIG. 4A. FIGS. 4A to 4C show a configuration obtained when the first resin layer 105 and the second resin layer 106 were formed by compression molding, whereas FIGS. 5A to 5C show a configuration obtained when the first resin layer 105 was formed by printing or potting, and the second resin layer 106 was formed by compression molding.

Figure 6A:
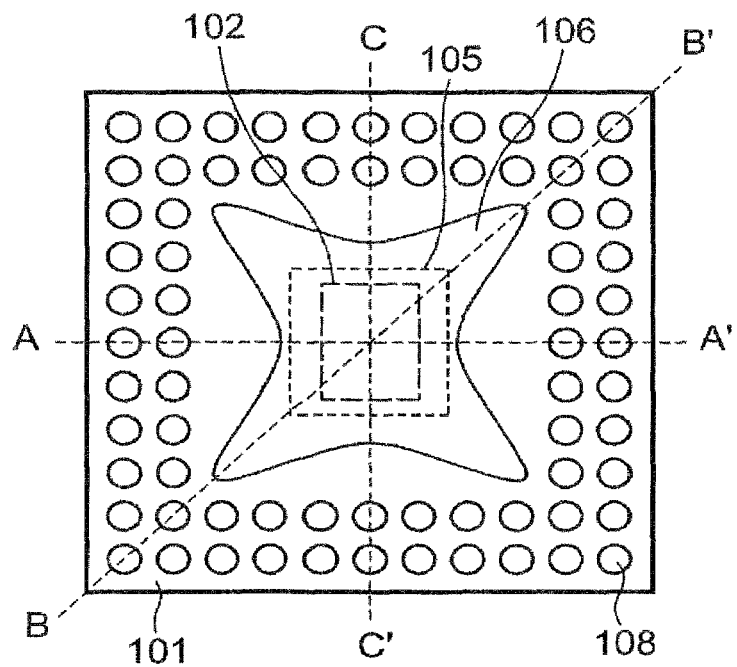
Figure 6B:
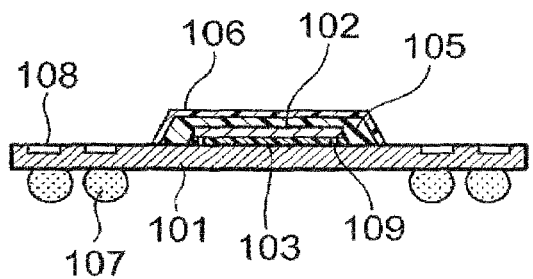
Figure 6C:
Figure 6D:
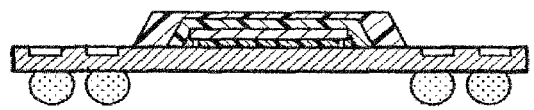
Figure 7A:
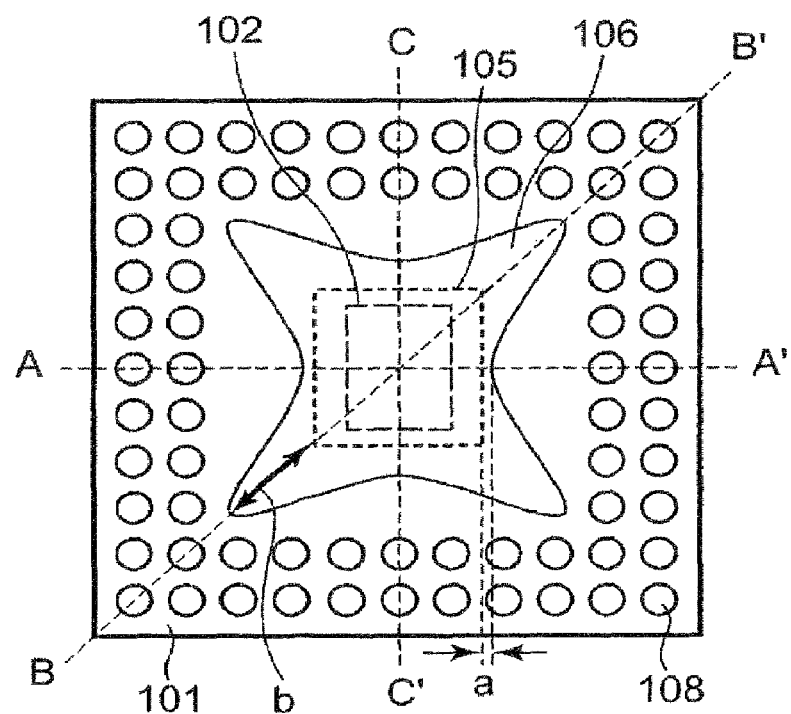
Figure 7B:
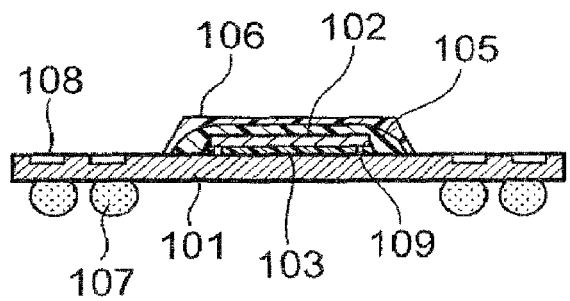
Figure 7C:
Figure 7D:

Alternatively, FIGS. 6A to 6D show a case where the plan view pattern of the semiconductor chip 102 is a rectangular pattern, and the plan view pattern of the wiring board 101 is a square pattern. FIG. 6A is a plan view, FIG. 6B is a sectional view taken along direction A-A' in FIG. 6A, FIG. 6C is a sectional view taken along direction B-B', and FIG. 6D is a sectional view taken along direction C-C'. The wiring board 101 and the semiconductor chip 102 are bonded by flip-chip bonding through the bumps 109 composed of gold, solder, or the like, and a gap formed therebetween is filled with the underfill resin 103. The resin covering the semiconductor chip 102 is composed of a double-layered structure of the first resin layer 105 and the second resin layer 106. The plan view patterns of the first resin layer 105 and the second resin layer 106 are same as those explained referring to FIG. 1A. For the case where the semiconductor chip 102 is rectangular, the semiconductor package may produce larger warping in the direction C-C', which is the direction along the long edges of the semiconductor chip 102, than in the direction A-A', which is the direction along the short edges. Accordingly, for the purpose of further improving the effect of canceling the warping, the second resin layer 106 may be formed so as to extend from the center of the wiring board 101 more largely towards the edges of the semiconductor chip 102 than the first resin layer 105, and may be configured so as to swell out from the center more largely beyond the long edges of the semiconductor chip 102 (direction C-C') than beyond the short edges (direction A-A'). The wiring board 101 has the solder balls 107 formed on the back surface thereof.

A method of manufacturing is same as that explained referring to FIGS. 1A to 1C, wherein FIGS. 6A to 6D show a configuration obtained when the first resin layer 105 and the second resin layer 106 were formed by compression molding, whereas FIGS. 7A to 7D show a configuration obtained when the first resin layer 105 was formed by printing or potting, and the second resin layer 106 was formed by compression molding.

Figure 8A:
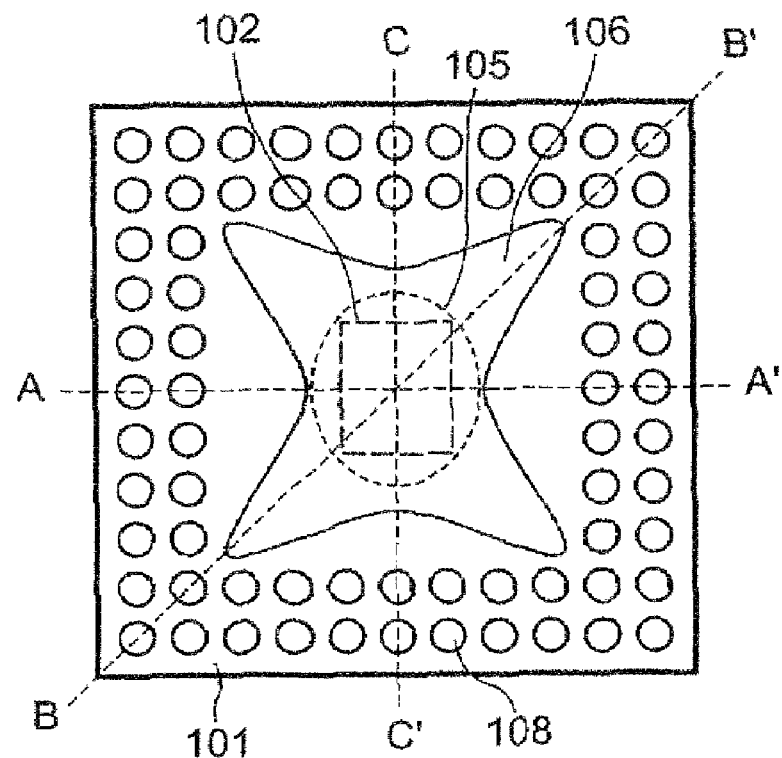
Figure 8B:
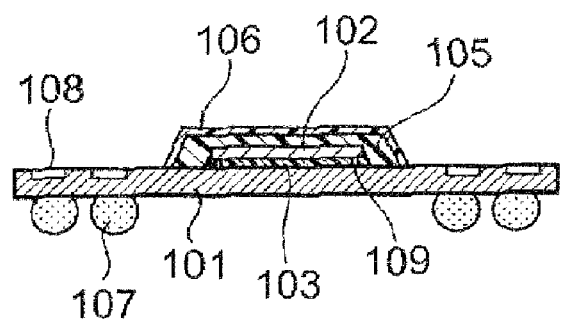
Figure 8C:
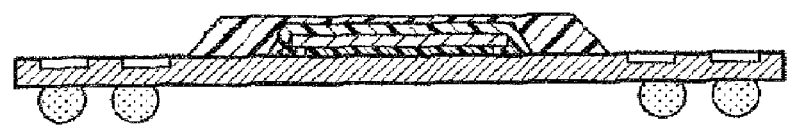
Figure 8D:
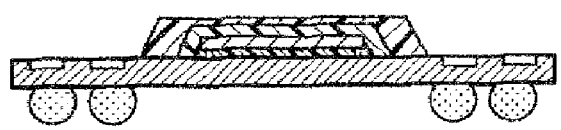
Figure 9A:
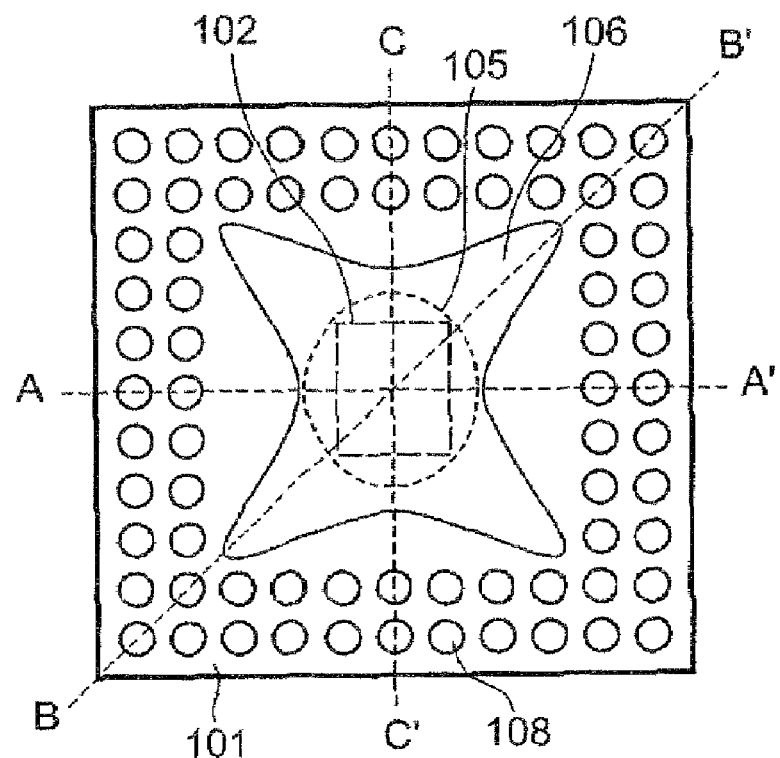
Figure 9B:
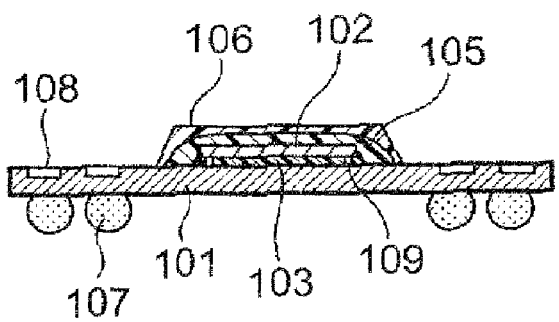
Figure 9C:
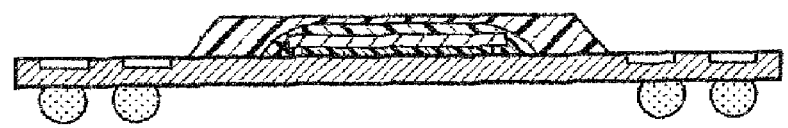
Figure 9D:
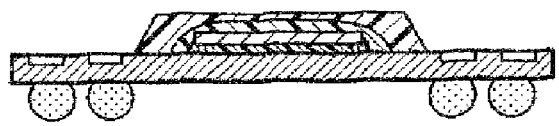
Figure 10A:
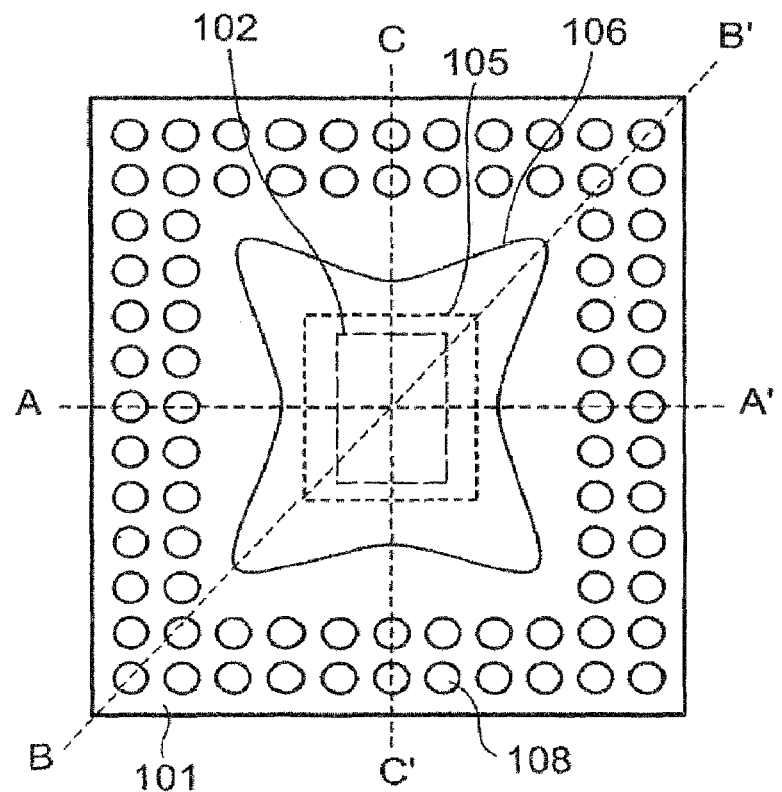
Figure 10B:
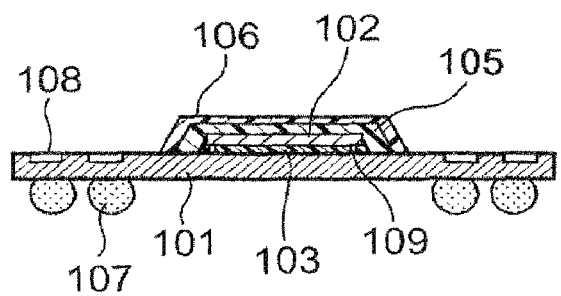
Figure 10C:
Figure 10D:
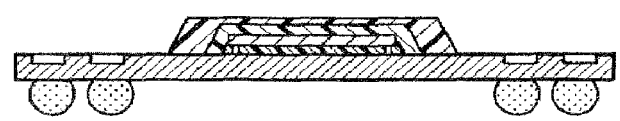
Figure 11A:
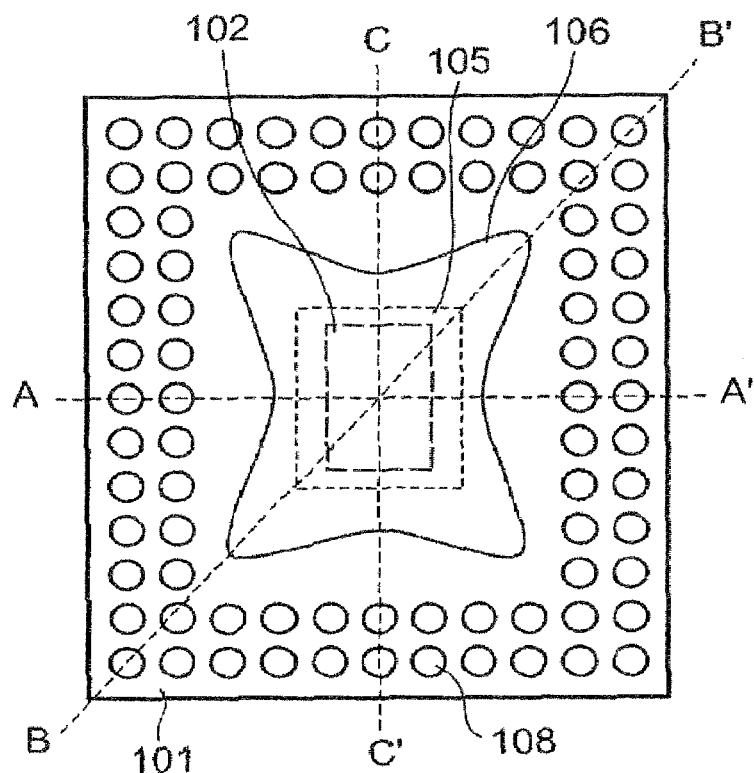
Figure 11B:
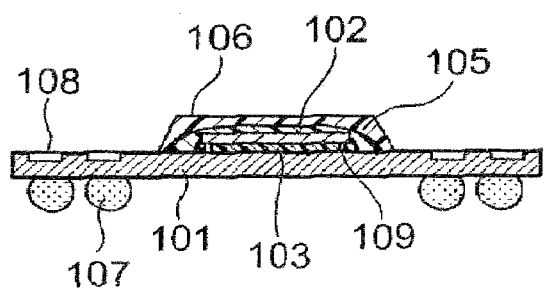
Figure 11C:
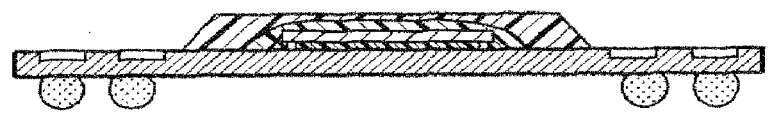
Figure 11D:
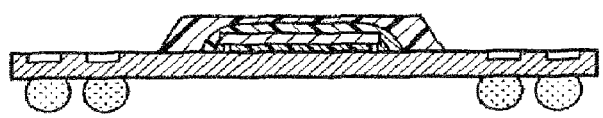

As a modified example for the case of using the rectangular semiconductor chip 102, the plan view pattern of the first resin layer 105 in the first semiconductor package may be ellipsoid, as shown in FIG. 8A. FIGS. 8A to 8D show a configuration obtained when the first resin layer 105 and the second resin layer 106 were formed by compression molding, whereas FIGS. 9A to 9D show a configuration obtained when the first resin layer 105 was formed by printing or potting, and the second resin layer 106 was formed by compression molding.

FIGS. 10A to 10D show a case where the plan view patterns of both of the wiring board 101 and the semiconductor chip 102 are rectangular patterns. The plan view pattern of the first resin layer 105 is analogous (rectangle) to the plan view pattern of the semiconductor chip 102. The plan view pattern of the second resin layer 106 is similar to that explained referring to FIG. 1A. As explained referring to FIGS. 8A to 8D, for the purpose of further improving the effect of canceling the warping, the second resin layer 106 may be formed so as to extend from the center of the wiring board 101 more largely towards the edges of the semiconductor chip 102 than the first resin layer 105, and may be configured so as to swell out from the center more largely beyond the long edges of the semiconductor chip 102 (direction C-C') than beyond the short edges (direction A-A').

A method of manufacturing is same as that described in the above, wherein FIGS. 10A to 10D show a configuration obtained when the first resin layer 105 and the second resin layer 106 were formed by compression molding, whereas FIGS. 11A to 11D show a configuration obtained when the first resin layer 105 was formed by printing or potting, and the second resin layer 106 was formed by compression molding.

Figure 12A:
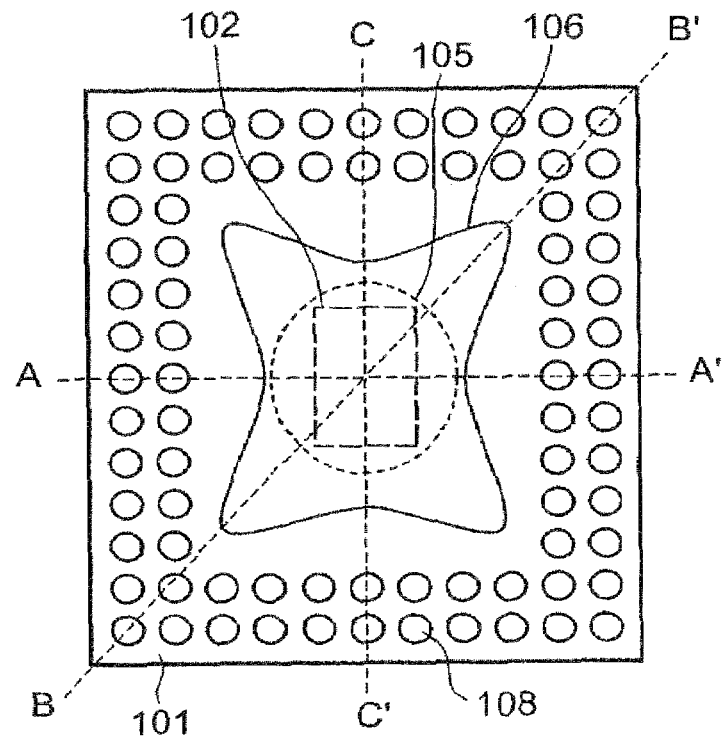
Figure 12B:
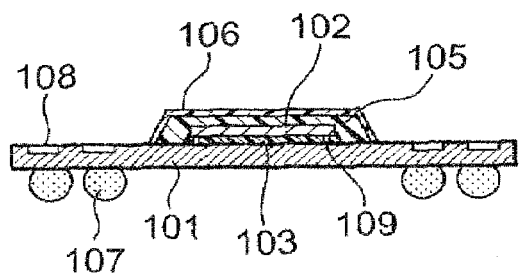
Figure 12C:
Figure 12D:
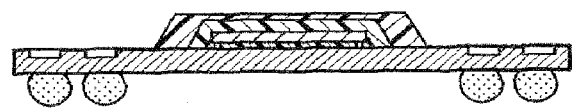
Figure 13A:
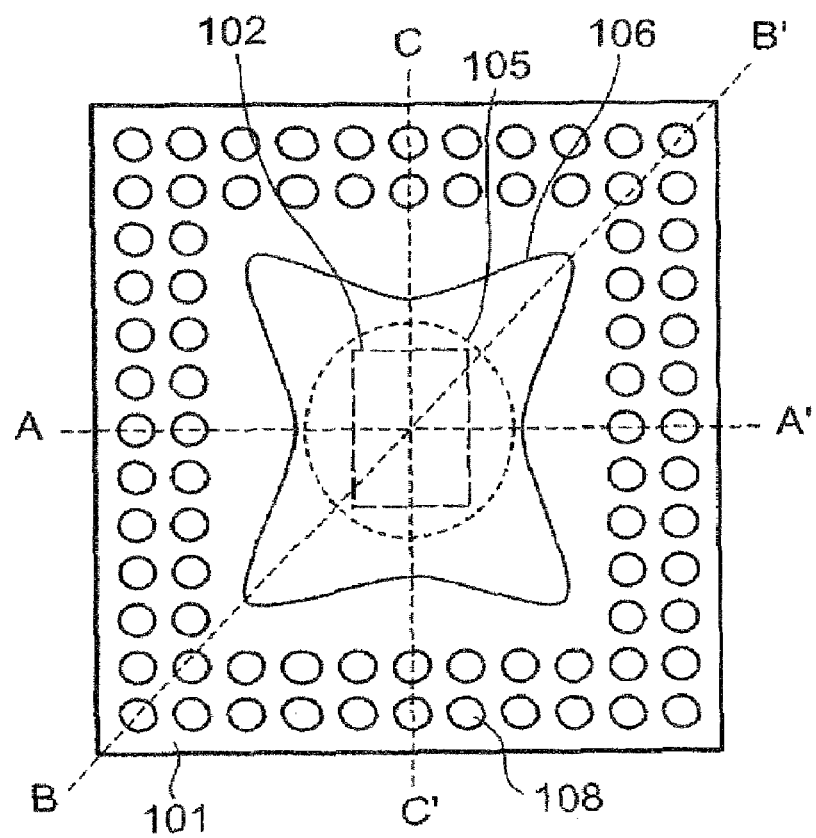
Figure 13B:
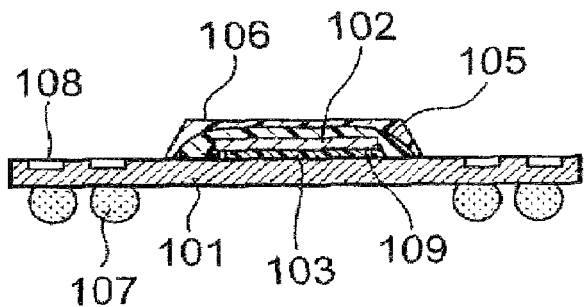
Figure 13C:
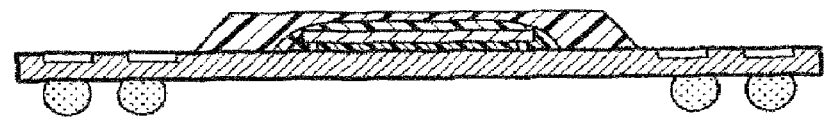
Figure 13D:
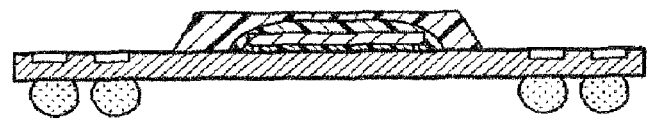

As a modified example, the plan view pattern of the first resin layer 105 in the first semiconductor package may be an elliptic pattern, as shown in FIG. 12A. FIGS. 12A to 12D show a configuration obtained when the first resin layer 105 and the second resin layer 106 were formed by compression molding, whereas FIGS. 13A to 13D show a configuration obtained when the first resin layer 105 was formed by printing or potting, and the second resin layer 106 was formed by compression molding.

Second Embodiment

A second embodiment differs from the first embodiment in that the plan view pattern of the first resin layer in the first semiconductor package is typically such as swelling out towards the edges of the semiconductor chip, which is typically a rhombic pattern or a cross pattern, and in that the plan view pattern of the second resin layer is analogous to that of the semiconductor chip or the wiring board. The embodiment will be explained referring to FIG. 14A to FIG. 20D.

Figure 14A:
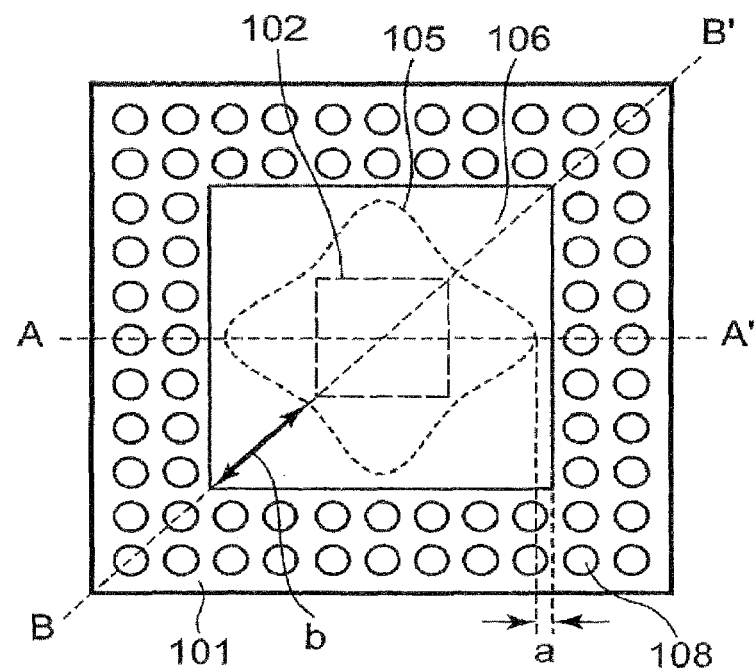
FIGS. 14A to 20D show semiconductor devices according to a second embodiment of the present invention.
Figure 14B:
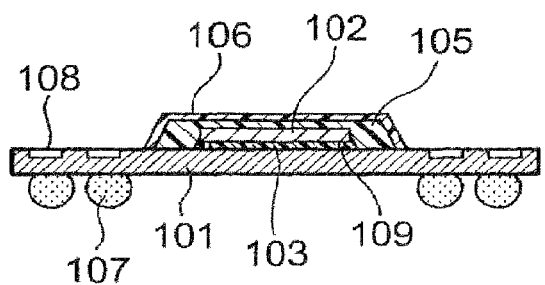
Figure 14C:

FIGS. 14A to 14C show a structure of the first semiconductor package according to the second embodiment of the present invention. FIG. 14A is a plan view, FIG. 14B is a sectional view taken along line A-A' in FIG. 14A, and FIG. 14C is a sectionals view taken along direction B-B'. The board on which the semiconductor chip 102 will be mounted is not specifically limited, allowing use of a wiring board 101 having therein an interconnect layer. Both of the wiring board 101 and the semiconductor chip 102 are square, bonded by flip-chip bonding through bumps 109 composed of gold, solder or the like, and have an underfill resin 103 filled in a gap therebetween. The resin layer covering the semiconductor chip 102 is composed of the first resin layer 105 and the second resin layer 106. The first resin layer 105 and the second resin layer 106 differ in the plan view pattern. The first resin layer 105 is good enough if it swells out from the center of the wiring board 101 more largely towards the edges (direction A-A') than towards the corners (direction B-B'), allowing a rhombic pattern or a cross pattern. It is to be understood that rhombus in the context of this patent specification include those having rounded corners, and those having rounded corners and a contour partially recessed towards the inside as shown in FIG. 14A. The plan view pattern of the second resin layer 106 is analogous (square) to that of the wiring board 101 or the semiconductor chip 102. The second resin layer 106 is preferably formed not so largely as being brought into contact with the lands 108. Similarly to as in the first embodiment, a relation a<b is satisfied, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106. The wiring board 101 has the solder balls 107 formed on the back surface thereof.

Figure 15A:
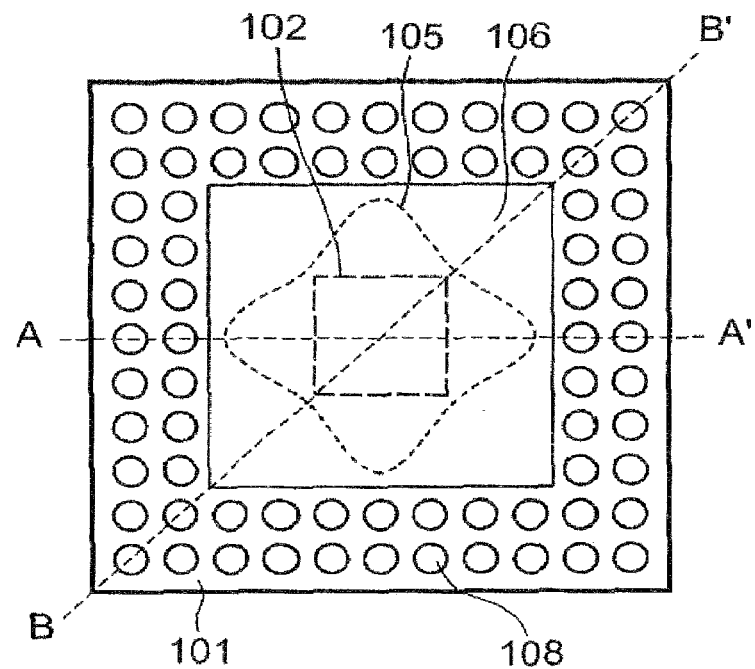
Figure 15B:
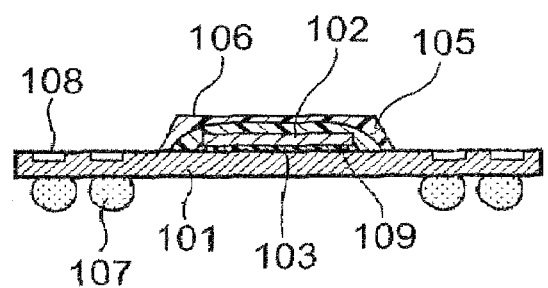
Figure 15C:

A method of manufacturing is same as that described in the first embodiment, wherein FIGS. 14A to 14C show a configuration obtained when the first resin layer 105 and the second resin layer 106 were formed by compression molding, whereas FIGS. 15A to 15C show a configuration obtained when the first resin layer 105 was formed by printing or potting, and the second resin layer 106 was formed by compression molding.

Figure 16A:
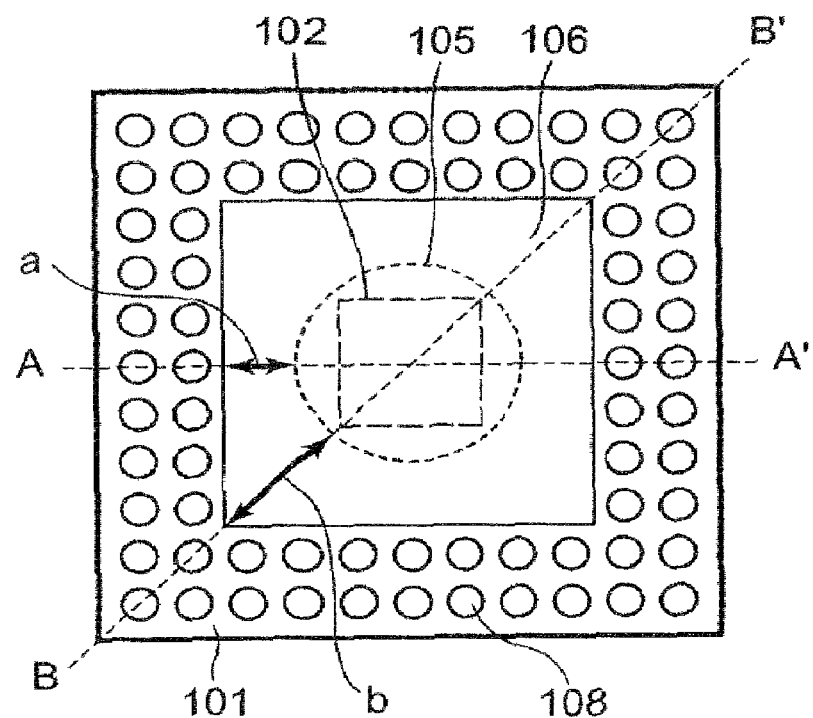
Figure 16B:
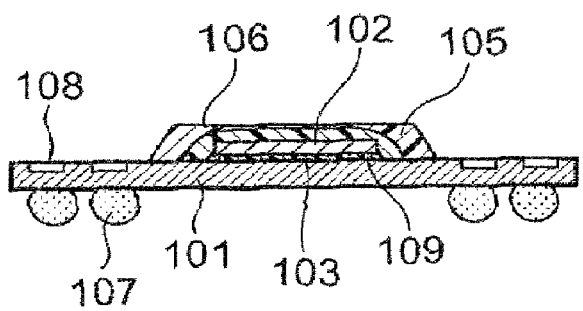
Figure 16C:
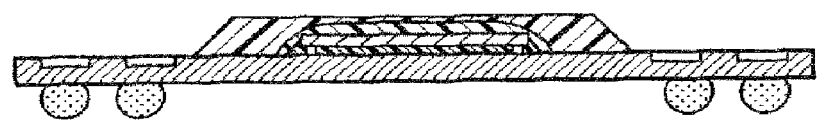

Another allowable configuration is such that the plan view pattern of the first resin layer 105 is a circular pattern, and the plan view pattern of the second resin layer 106 is a square pattern, as shown in FIGS. 16A to 16C. As shown in FIG. 16A, the first semiconductor package satisfies a relation a<b, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106.

Figure 17A:
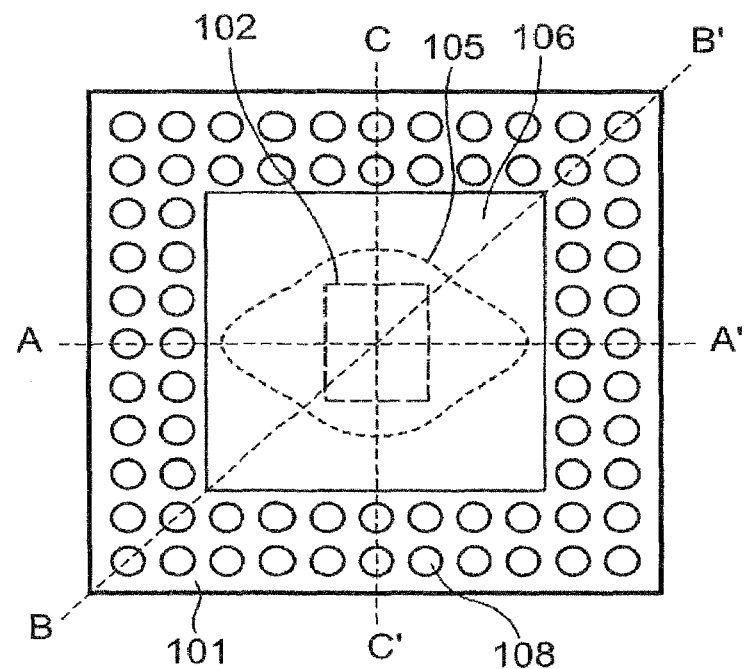
Figure 17B:
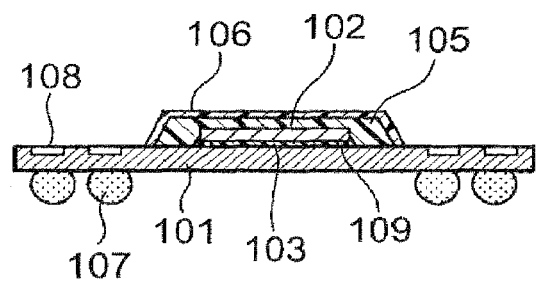
Figure 17C:
Figure 17D:
Figure 18A:
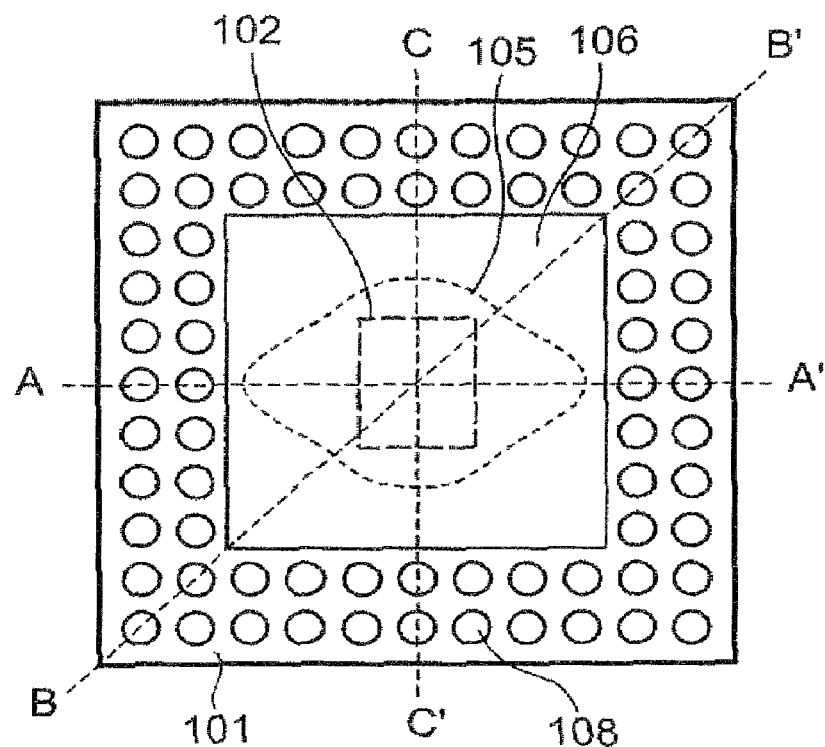
Figure 18B:
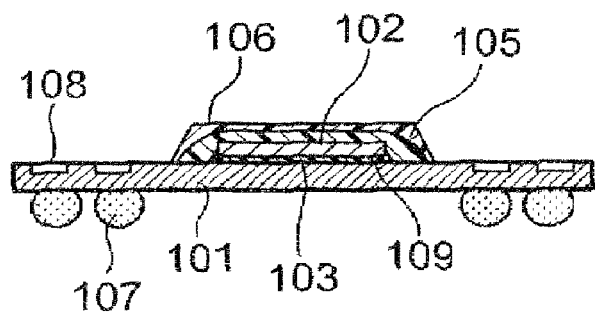
Figure 18C:
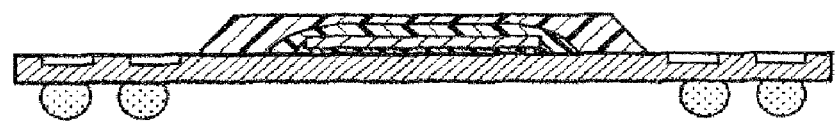
Figure 18D:
Figure 19A:
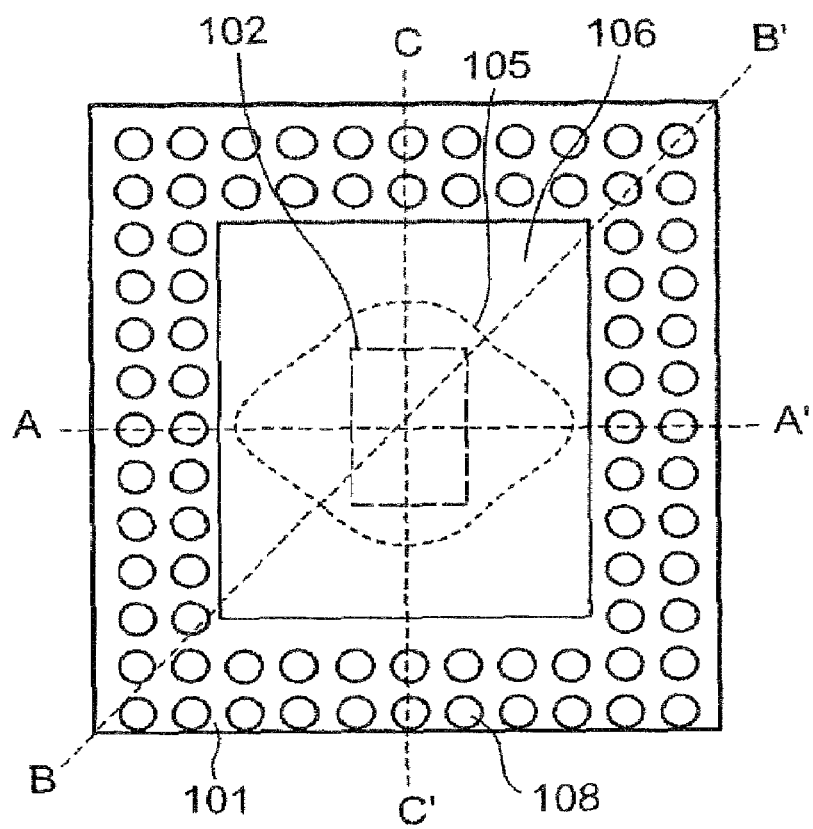
Figure 19B:
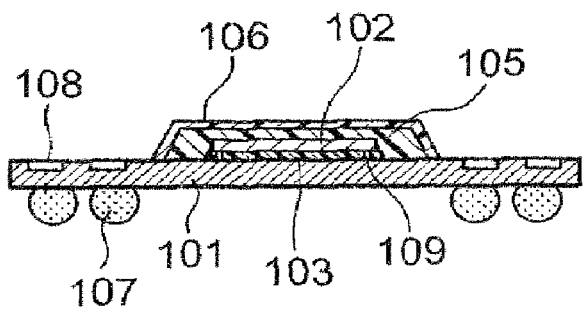
Figure 19C:
Figure 19D:
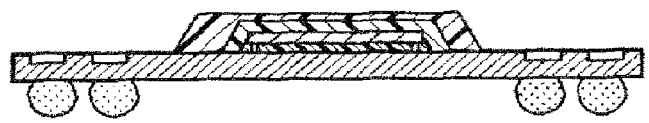
Figure 20A:
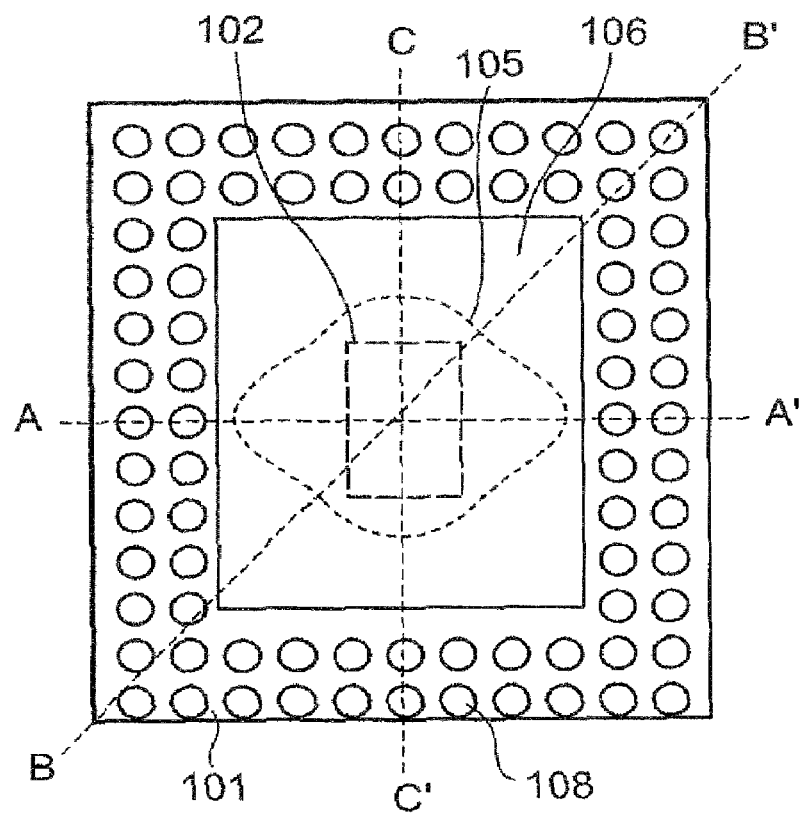
Figure 20B:
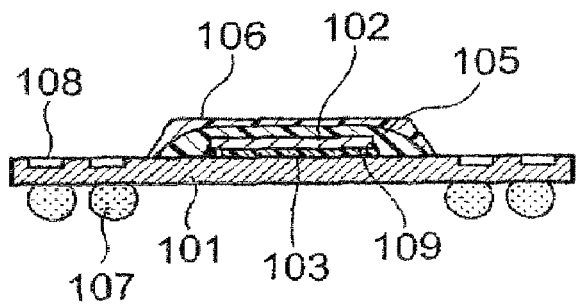
Figure 20C:
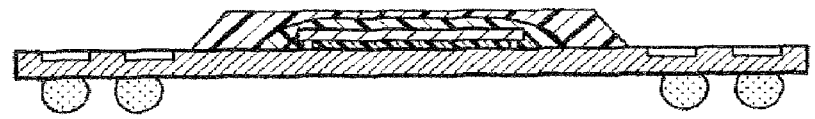
Figure 20D:
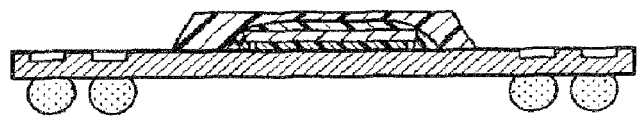

FIGS. 17A to 17D show a case where the plan view pattern of the semiconductor chip 102 is a rectangular pattern, and the plan view pattern of the wiring board 101 is a square pattern. FIG. 17A is a plan view, FIG. 17B is a sectional view taken along direction A-A' in FIG. 17A, FIG. 17C is a sectional view taken along direction B-B', and FIG. 17D is a sectional view taken along direction C-C'. The wiring board 101 and the semiconductor chip 102 are bonded by flip-chip bonding through bumps 109 composed of gold, solder or the like, and have an underfill resin 103 filled in a gap therebetween. The resin layer covering the semiconductor chip 102 is composed of a double-layered structure of the first resin layer 105 and the second resin layer 106. The first resin layer 105 and the second resin layer 106 differ in the plan view pattern. The plan view pattern of the first resin layer 105 is a rhombic pattern, and the plan view pattern of the second resin layer 106 is analogous (square) to that of the wiring board 101. The first resin layer 105 is good enough if it swells out from the center of the wiring board 101 more largely towards the edges (direction A-A' and direction C-C') than towards the corners (direction B-B'), and may be given typically as a cross pattern. As explained in the first embodiment, for the case where the semiconductor chip 102 is rectangular, the semiconductor package may produce larger warping in the direction C-C', which is the direction along the long edges of the semiconductor chip 102, than in the direction A-A', which is the direction along the short edges. Accordingly, for the purpose of further improving the effect of canceling the warping, the first resin layer 105 may be formed so as to swell out from the center more largely beyond the long edges of the semiconductor chip 102 (direction C-C') than beyond the short edges (direction A-A'). The wiring board 101 has the solder balls 107 formed on the back surface thereof.

A method of manufacturing is same as that explained in the first embodiment, wherein FIGS. 17A to 17D show a configuration obtained when the first resin layer 105 and the second resin layer 106 were formed by compression molding, whereas FIGS. 18A to 18D show a configuration obtained when the first resin layer 105 was formed by printing or potting, and the second resin layer 106 was formed by compression molding.

FIGS. 19A to 19D show a case where the plan view patterns of both of the wiring board 101 and the semiconductor chip 102 are rectangular patterns. The first resin layer 105 and the second resin layer 106 differ in the plan view pattern. The plan view pattern of the first resin layer 105 is such as swelling out from the center of the wiring board 101 more largely towards the edges than towards the corners (direction B-B'), and is typically a rhombic pattern. As explained referring to FIGS. 17A to 17D, for the purpose of further improving the effect of canceling the warping, the first resin layer 105 may be formed so as to swell out from the center more largely beyond the long edges of the semiconductor chip 102 (direction C-C') than beyond the short edges (direction A-A'). The plan view pattern of the second resin layer 106 is analogous (rectangle) to that of the wiring board 101 or the semiconductor chip 102. The second resin layer 106 is preferably formed not so largely as being brought into contact with the lands 108. The wiring board 101 has the solder balls 107 formed on the back surface thereof.

A method of manufacturing is same as that explained in the first embodiment, wherein FIGS. 19A to 19D show a configuration obtained when the first resin layer 105 and the second resin layer 106 were formed by compression molding, whereas FIGS. 20A to 20D show a configuration obtained when the first resin layer 105 was formed by printing or potting, and the second resin layer 106 was formed by compression molding.

The PoP structure may be manufactured similarly to as described in the first embodiment, by bonding, onto the lands 108 of the first semiconductor package, the bumps opposed to the lands formed on the back surface of the second semiconductor package 200 (not shown).

Third Embodiment

A third embodiment differs from the second embodiment in that the second resin layer of the first semiconductor package is formed over the entire surface of the wiring board. The embodiment will be explained referring to FIGS. 21A to 27D.

Figure 21A:
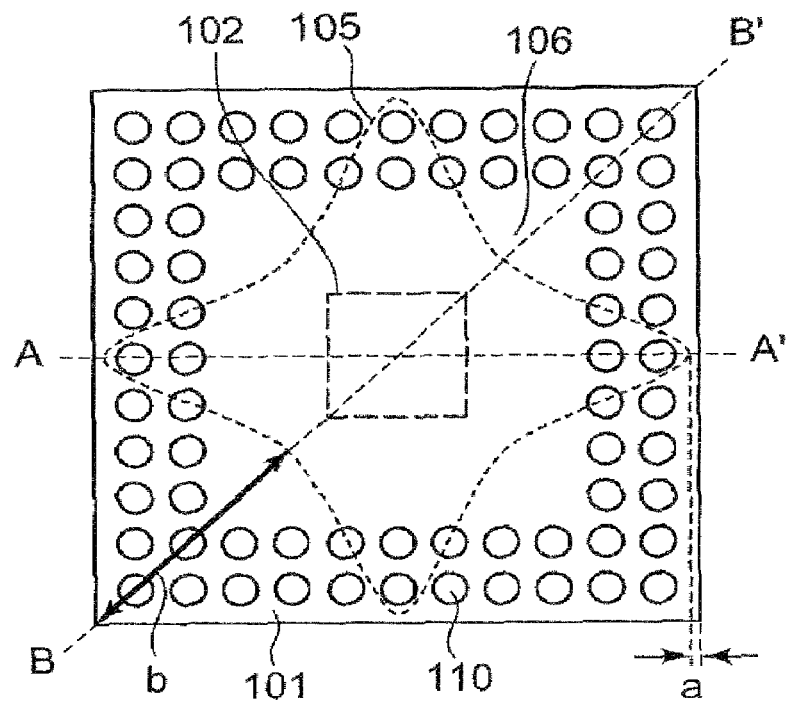
FIGS. 21A to 27D show semiconductor devices according to a third embodiment of the present invention.
Figure 21B:
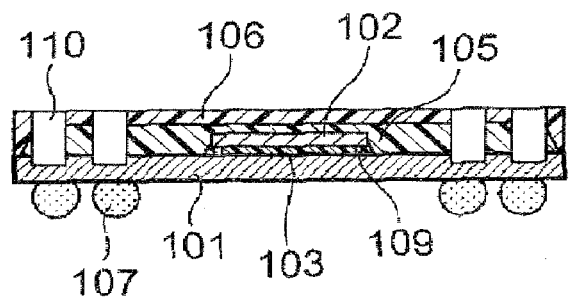
Figure 21C:
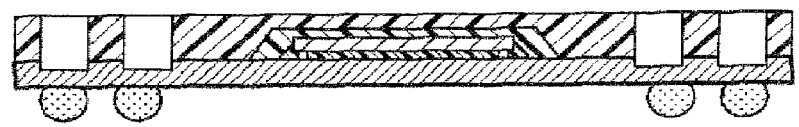

FIGS. 21A to 21C show a configuration of the first semiconductor package according to the third embodiment of the present invention. FIG. 21A is a plan view, FIG. 21B is a sectional view taken along direction A-A' in FIG. 21A, and FIG. 21C is a sectional view taken along direction B-B'. The board on which the semiconductor chip 102 will be mounted may be a wiring board 101, for example. Both of the wiring board 101 and the semiconductor chip 102 have square plan view patterns, bonded by flip-chip bonding through bumps 109 composed of gold, solder or the like, and have an underfill resin 103 filled in a gap therebetween. The resin layer covering the semiconductor chip 102 is composed of the first resin layer 105 and the second resin layer 106. The first resin layer 105 and the second resin layer 106 differ in the plan view pattern. The first resin layer 105 is selectively formed over the wiring board 101, and the plan view pattern thereof is such as swelling out from the center of the wiring board 101 more largely towards the edges (direction A-A') than towards the corners (direction B-B'), typically given as a cross pattern as shown in the drawing. The plan view pattern of the first resin layer 105 may also be a rhombic pattern. The second resin layer 106 is formed over the entire portion of the wiring board 101. Similarly to the other embodiments, a relation a<b is satisfied, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106. The wiring board 101 has the solder balls 107 formed on the back surface thereof.

Figure 22A:
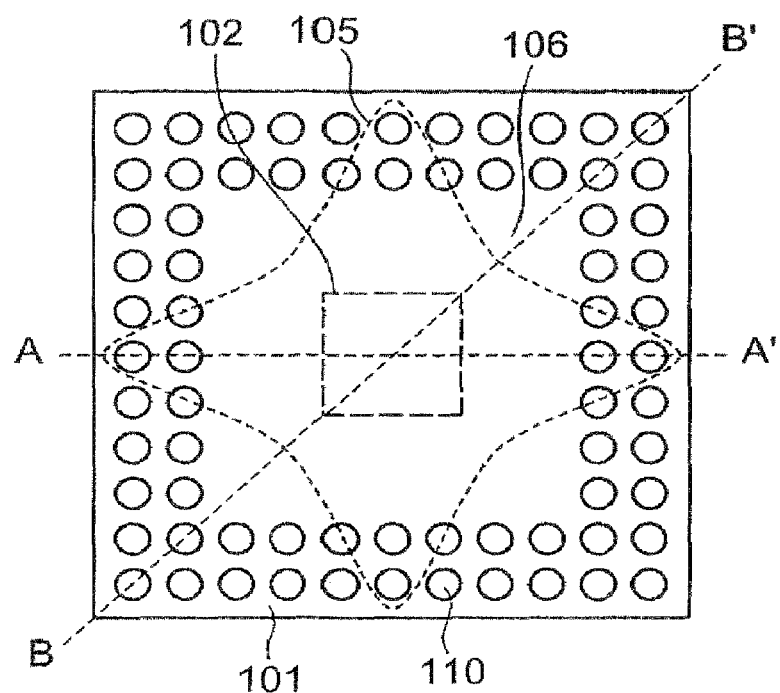
Figure 22B:
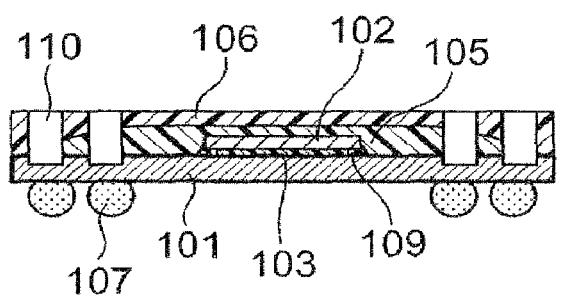
Figure 22C:

A method of manufacturing is similar to that described in the other embodiments. Through-lands 110 herein are formed by using a die or the like, and are filled with a metal such as copper. FIGS. 21A to 21C show a configuration obtained when the first resin layer 105 and the second resin layer 106 were formed by compression molding, whereas FIGS. 22A to 22C show a configuration obtained when the first resin layer 105 was formed by printing or potting, and the second resin layer 106 was formed by compression molding.

Figure 23A:
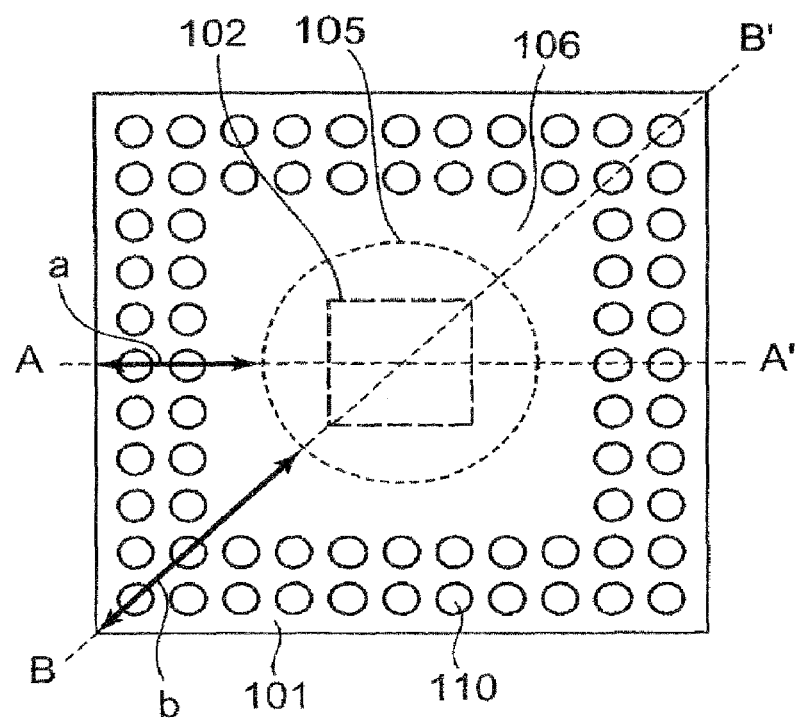
Figure 23B:
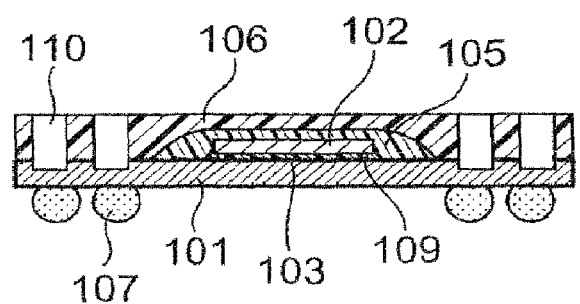
Figure 23C:
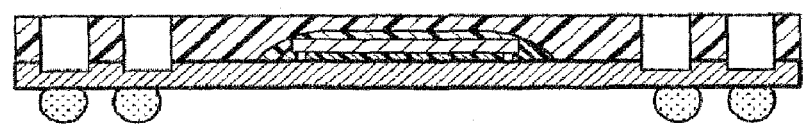

Another allowable configuration is such that the plan view pattern of the first resin layer 105 is a circular pattern, and the plan view pattern of the second resin layer 106 is a square pattern, as shown in FIGS. 23A to 23C. As shown in FIG. 23A, the first semiconductor package satisfies a relation a<b, where "a" is difference in length in the direction from the center of the wiring board 101 towards the edges between the first resin layer 105 and the second resin layer 106, and "b" is difference in length in the direction from the center of the wiring board 101 towards the corners between the first resin layer 105 and the second resin layer 106.

Figure 24A:
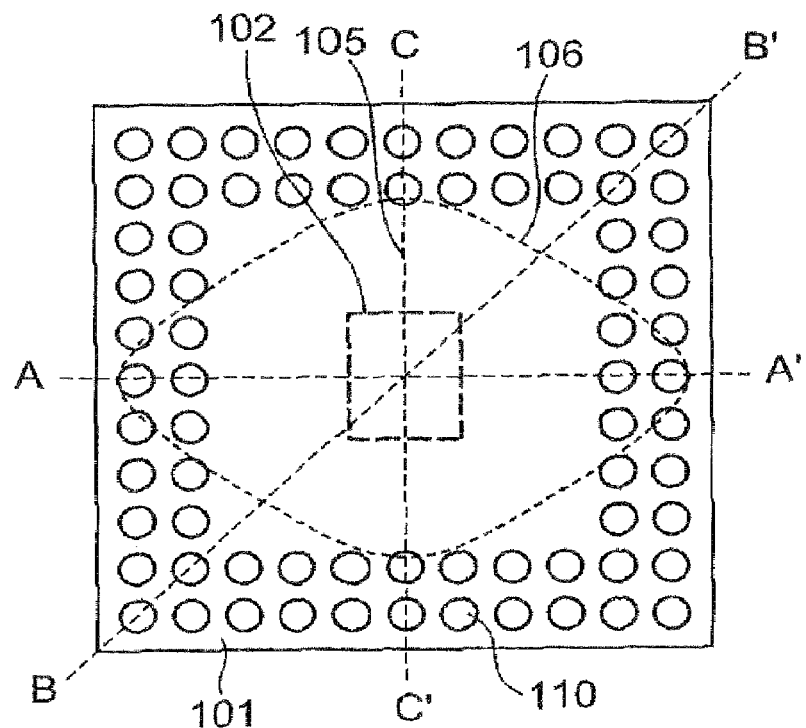
Figure 24B:
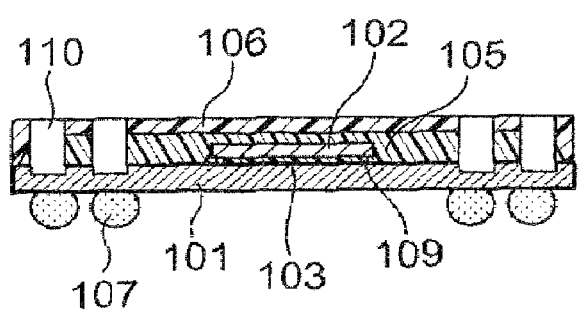
Figure 24C:
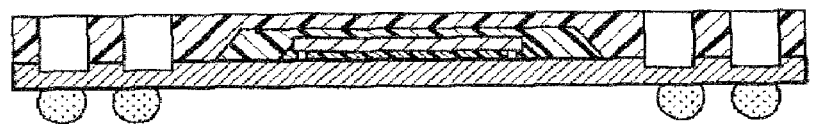
Figure 24D:
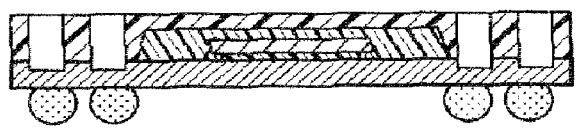
Figure 25A:
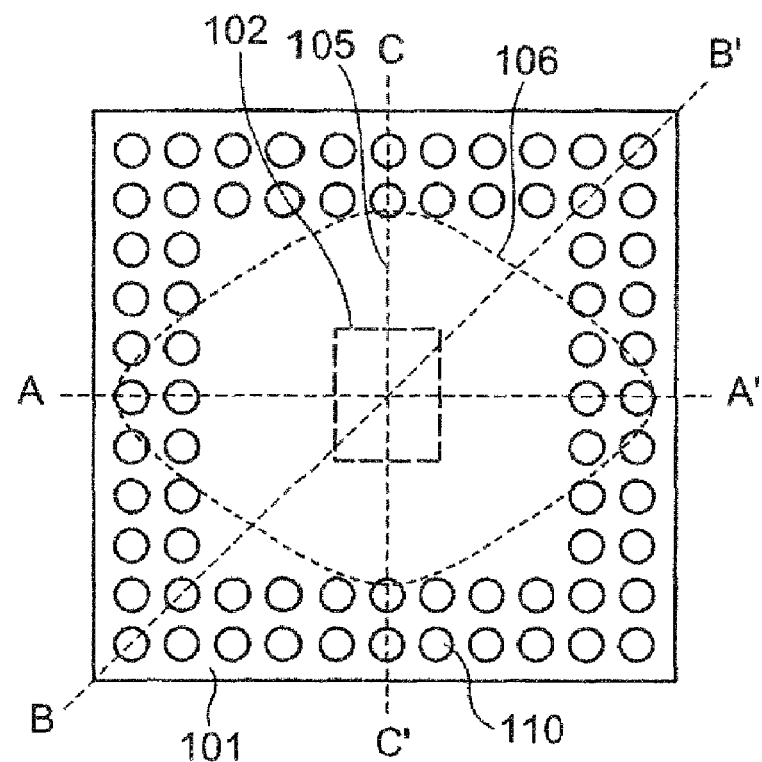
Figure 25B:
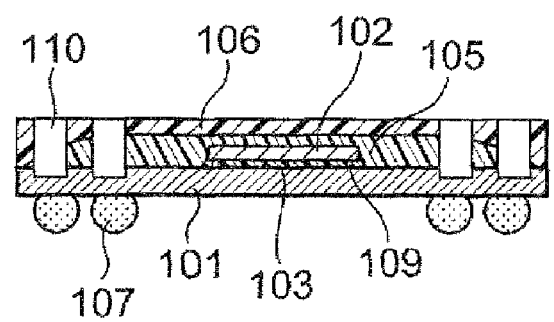
Figure 25C:
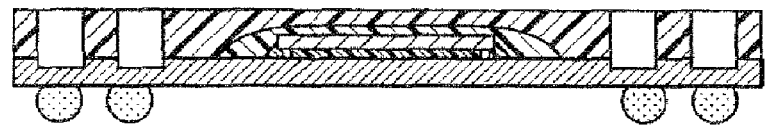
Figure 25D:
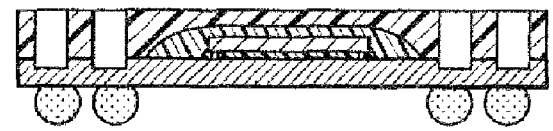
Figure 26A:
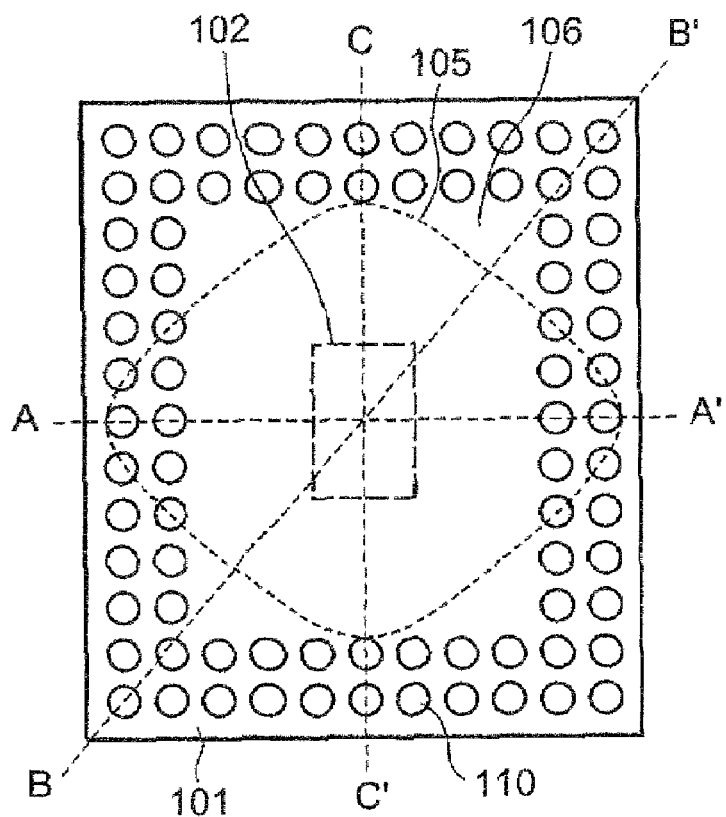
Figure 26B:
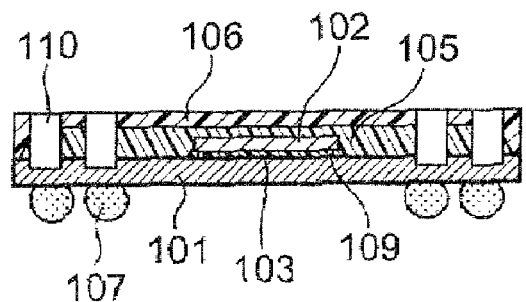
Figure 26C:
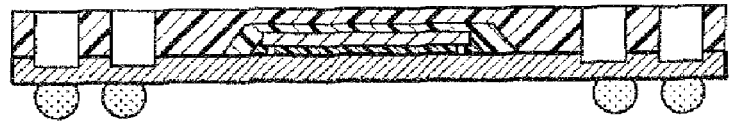
Figure 26D:
Figure 27A:
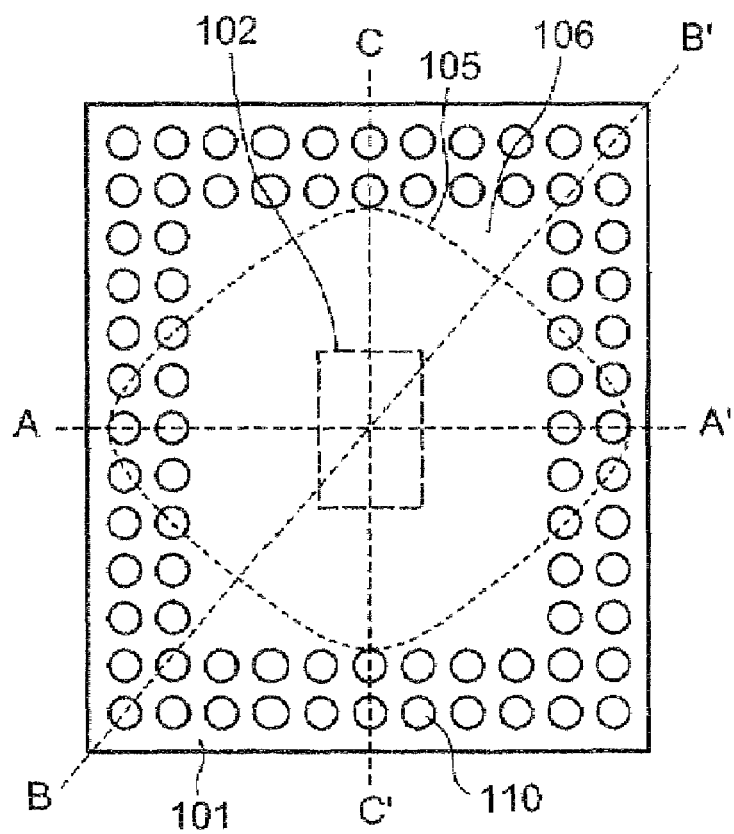
Figure 27B:
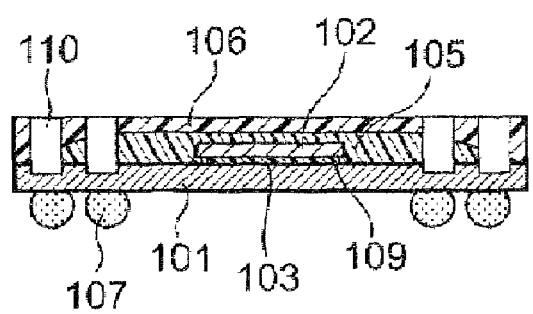
Figure 27C:
Figure 27D:
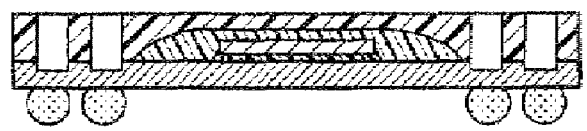
Figure 28:
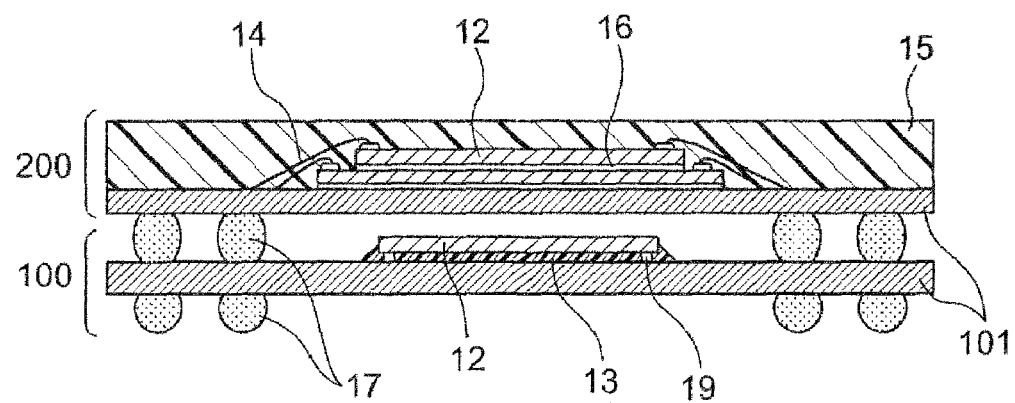
FIGS. 28 to 32C show conventional examples for the reference of explaining the present invention.
Figure 29A:
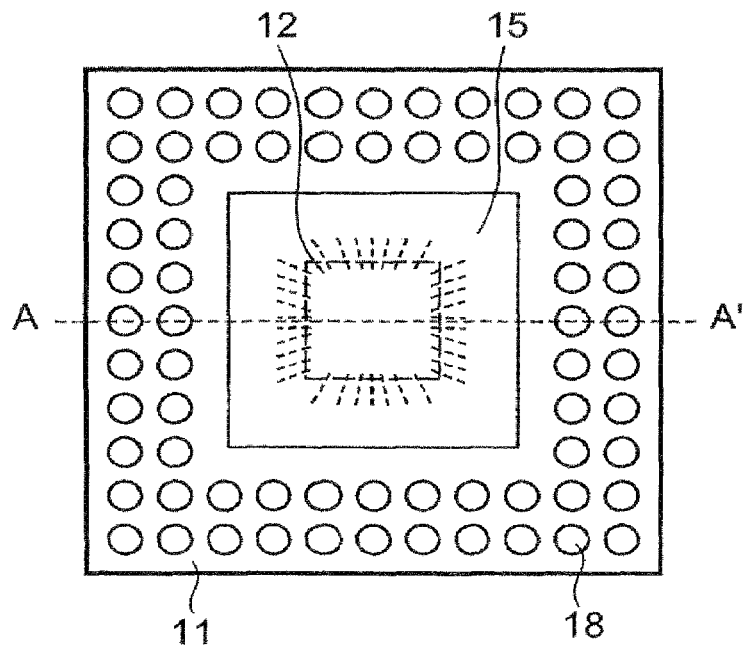
Figure 29B:
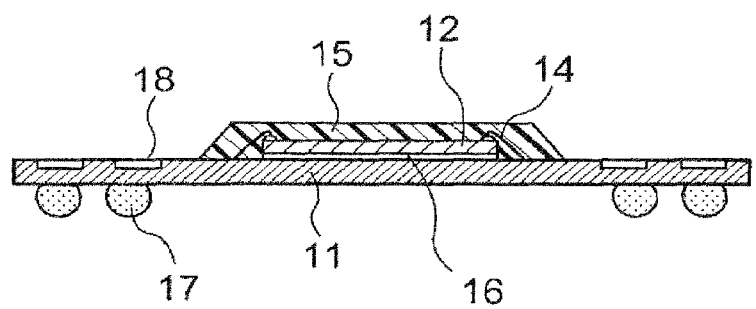
Figure 30A:
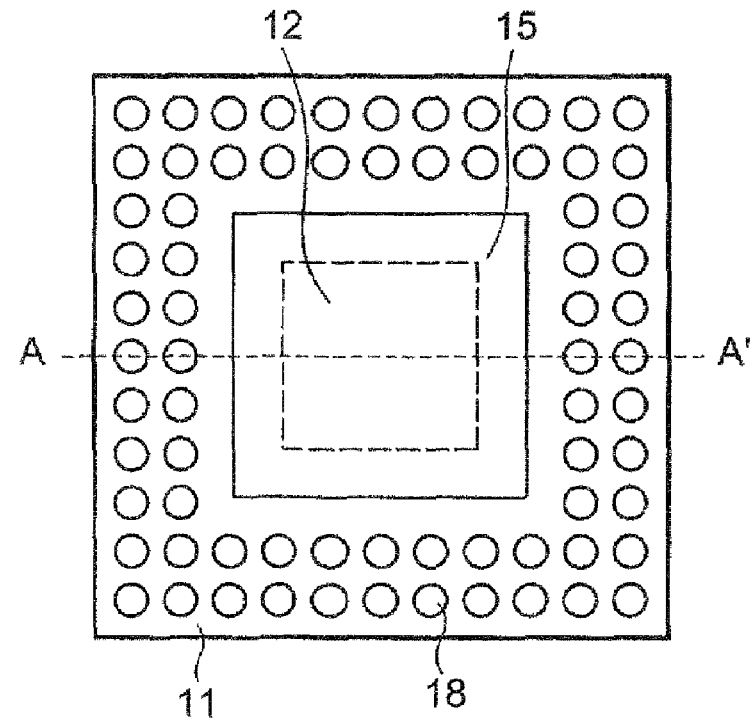
Figure 30B:
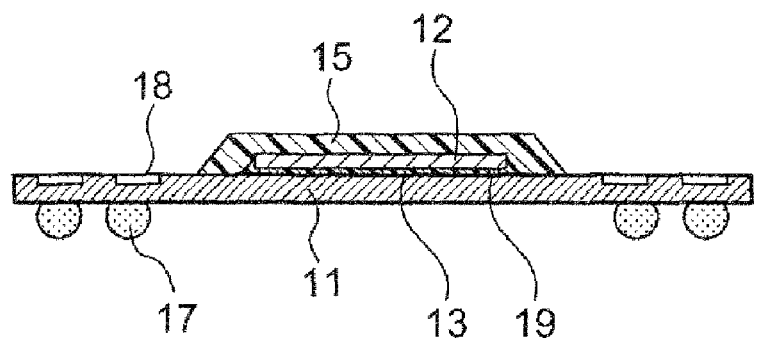
Figure 31A:
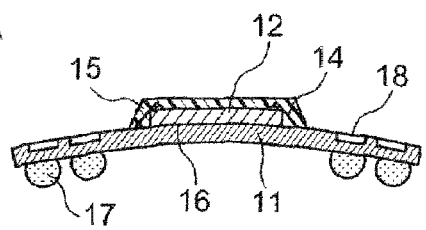
Figure 31A:
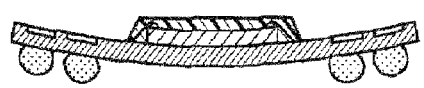
Figure 31B:
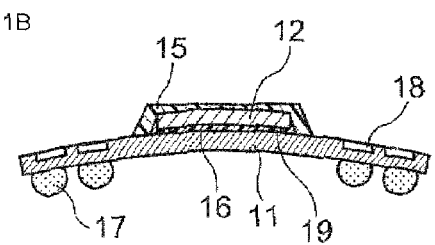
Figure 31B:
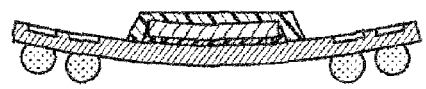
Figure 31C:
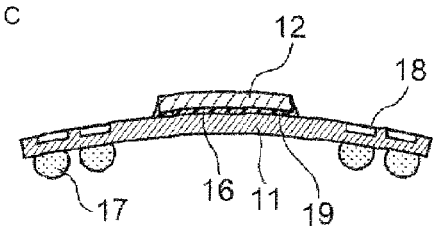
Figure 31C:
Figure 32A:
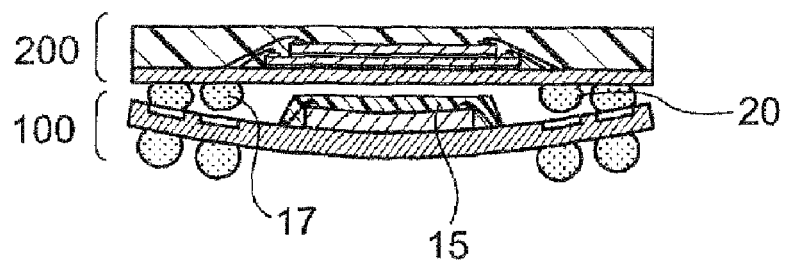
Figure 32B:
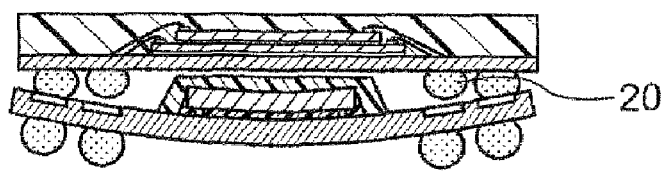
Figure 32C:
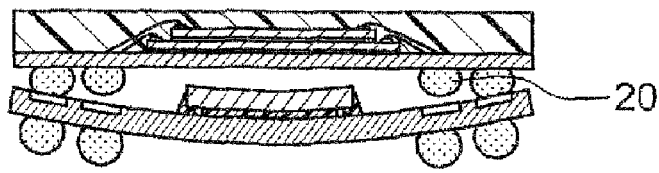

FIGS. 24A to 24D show a case where the plan view pattern of the semiconductor chip 102 is a rectangular pattern, and the plan view pattern of the wiring board 101 is a square pattern. FIG. 24A is a plan view, FIG. 24B is a sectional view taken along direction A-A' in FIG. 24A, FIG. 24C is a sectional view taken along direction B-B', and FIG. 24D is a sectional view taken along direction C-C'. The wiring board 101 and the semiconductor chip 102 are bonded by flip-chip bonding through bumps 109 composed of gold, solder or the like, and have an underfill resin 103 filled in a gap therebetween. The resin layer covering the semiconductor chip 102 is composed of a double-layered structure of the first resin layer 105 and the second resin layer 106. The plan view pattern of the first resin layer 105 is such as swelling out from the center of the wiring board more largely towards the edges than towards the corners (direction B-B'), and is typically given as a rhombic pattern. This may also be a cross pattern similarly to as shown in FIG. 21A. Degree of swelling of the first resin layer 105 in the direction towards the edges may be same in both directions beyond the long edges and the short edges of the semiconductor chip 102. The second resin layer 106 is formed over the entire surface of the wiring board 102. As described in the other embodiments, for the case where the semiconductor chip 102 is rectangular, the semiconductor package may produce larger warping in the direction C-C', which is the direction along the long edges of the semiconductor chip 102, than in the direction A-A', which is the direction along the short edges. Accordingly, for the purpose of further improving the effect of canceling the warping, the first resin layer 105 may be formed also so as to swell out more largely beyond the long edges of the semiconductor chip 102 (direction C-C') than beyond the short edges (direction A-A') as shown in the drawing. The wiring board 101 has the solder balls 107 formed on the back surface thereof.

FIGS. 24A to 24D show a configuration obtained when the first resin layer 105 and the second resin layer 106 were formed by compression molding, whereas FIGS. 25A to 25D show a configuration obtained when the first resin layer 105 was formed by printing or potting, and the second resin layer 106 was formed by compression molding.

FIGS. 26A to 26D show a case where the plan view pattern of both of the wiring board 101 and the semiconductor chip 102 is a rectangular pattern. The first resin layer 105 and the second resin layer 106 differ in the plan view pattern. The first resin layer 105 has a plan view pattern such as swelling out from the center of the wiring board more largely towards the edges than towards the corners (direction B-B'), and is typically given as a rhombic pattern. This may also be a cross pattern. Degree of swelling of the first resin layer 105 in the direction towards the edges may be same in both directions beyond the long edges and the short edges of the semiconductor chip 102. However, in view of improving the effect of canceling the warping, the degree of swelling of the first resin layer 105 towards the edges may be set larger beyond the long edges of the semiconductor chip 102 (direction C-C') than beyond the short edges (direction A-A'), as explained referring to FIGS. 24A to 24D. The second resin layer 106 is formed over the entire surface of the wiring board 101. The wiring board 101 has solder balls 107 formed on the back surface thereof.

FIGS. 26A to 26D show a configuration obtained when the first resin layer 105 and the second resin layer 106 were formed by compression molding, whereas FIGS. 27A to 27D show a configuration obtained when the first resin layer 105 was formed by printing or potting, and the second resin layer 106 was formed by compression molding.

The PoP structure may be manufactured by bonding, onto through-lands 110 of the first semiconductor package, the bumps opposed to the lands formed on the back surface of the second semiconductor package (not shown).

In the above-described embodiment, other possible cases may be such that the wiring board is rectangular and the semiconductor chip is square, and such that both of the wiring board and the semiconductor chip are rectangular, being arranged so as to cross the individual directions of long edges with each other, wherein configurations or the like of the first resin layer and the second resin layer may arbitrarily be modified as being adapted to the individual cases.

The individual embodiments, although explained while referring to the configurations having the first semiconductor packages formed by flip-chip bonding, may include any other configurations having the first semiconductor packages formed typically by wire bonding.

It is apparent that the present invention is not limited to the above embodiments that may be modified and changed without departing from the scope and spirit of the invention.

What is claimed is:

1. A semiconductor device having a semiconductor chip connected to a board having terminal portions formed thereon, a first resin layer covering said semiconductor chip, and a second resin layer covering said first resin layer,
wherein patterns of said first resin layer and said second resin layer differ in plan view and satisfy a relation of $a<b$, where "a" is a difference in length in the direction from the center of said board towards the edges between said first resin layer and said second resin layer and "b" is a difference in length in the direction from the center of said board towards the corners between said first resin layer and said second resin layer, and
wherein said second resin layer has a plan view pattern swelled out from said center more largely towards the corners than towards the edges.

2. The semiconductor device as claimed in claim 1, wherein the plan view pattern of said first resin layer has a same geometric shape as a plan view pattern of one of said semiconductor chip and said board.

3. The semiconductor device as claimed in claim 1, wherein the plan view pattern of said first resin layer is a circular pattern or an elliptic pattern.

4. The semiconductor device as claimed in claim 1, wherein coefficient of thermal expansion of said second resin layer is larger than that of said first resin layer.

5. A stacked semiconductor device configured by stacking another semiconductor device onto the semiconductor device of claim 1, and by connecting terminal portions opposed to each other.

6. A semiconductor device having a semiconductor chip connected to a board having terminal portions formed thereon, a first resin layer covering said semiconductor chip, and a second resin layer covering said first resin layer,
wherein patterns of said first resin layer and said second resin layer differ in plan view and satisfy a relation of $a<b$, where "a" is a difference in length in the direction from the center of said board towards the edges between said first resin layer and said second resin layer and "b" is a difference in length in the direction from the center of said board towards the corners between said first resin layer and said second resin layer, and
wherein said first resin layer has a plan view pattern swelled out from said center more largely towards the edges than towards the corners, and the plan view pattern of said second resin layer has a same geometric shape as a plan view pattern of one of said board and said semiconductor chip.

7. The semiconductor device as claimed in claim 6, wherein the plan view pattern of said first resin layer is a circular pattern, a rhombic pattern or a cross pattern.

8. The semiconductor device as claimed in claim 6, wherein the plan view pattern of said first resin layer is a circular pattern, a rhombic pattern or a cross pattern.

* * * * *